United States Patent
Kajigaya

(10) Patent No.: US 8,072,828 B2
(45) Date of Patent: Dec. 6, 2011

(54) SENSE AMPLIFIER CIRCUIT AND SEMICONDUCTOR MEMORY DEVICE

(75) Inventor: Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 170 days.

(21) Appl. No.: 12/461,859

(22) Filed: Aug. 26, 2009

(65) Prior Publication Data

US 2010/0061170 A1    Mar. 11, 2010

(30) Foreign Application Priority Data

Aug. 29, 2008   (JP) ................................. 2008-222938

(51) Int. Cl.
  *G11C 7/02* (2006.01)
(52) U.S. Cl. ....................................... 365/207; 365/205
(58) Field of Classification Search .................. 365/207, 365/205, 189.09
  See application file for complete search history.

(56) References Cited

U.S. PATENT DOCUMENTS

| 5,237,533 | A | * | 8/1993 | Papaliolios | ................... | 365/145 |
| 6,154,402 | A | | 11/2000 | Akita | | |
| 6,594,187 | B2 | | 7/2003 | Ito | | |
| 6,710,628 | B2 | * | 3/2004 | Afghahi et al. | .................. | 327/52 |
| 6,901,019 | B2 | * | 5/2005 | Terzioglu et al. | ............. | 365/205 |

FOREIGN PATENT DOCUMENTS

| JP | 11-16384 | 1/1999 |
| JP | 2000-195268 | 7/2000 |
| JP | 2002-157885 | 5/2002 |
| JP | 2007-73121 | 3/2007 |

* cited by examiner

*Primary Examiner* — Andy Phung
(74) *Attorney, Agent, or Firm* — McGinn IP Law Group PLLC

(57) ABSTRACT

A single-ended sense amplifier circuit comprises first and second MOS transistors and first and second voltage setting circuits. The first MOS transistor supplies a predetermined voltage to the bit line and switches connection between the bit line and a sense node in response to a control voltage, and the second MOS transistor having a gate connected to the sense node amplifies a signal transmitted from the bit line via the first MOS transistor. The first voltage setting circuit sets the bit line to a first voltage, and the second voltage setting circuit sets the sense node to a second voltage. In the sense amplifier circuit, after setting the bit line and the sense node to respective voltages, the bit line is driven in a charge distributing mode via the first MOS transistor so that a signal voltage at the sense node is amplified by the second MOS transistor.

26 Claims, 23 Drawing Sheets

US 8,072,828 B2

SENSE AMPLIFIER CIRCUIT AND SEMICONDUCTOR MEMORY DEVICE

BACKGROUND OF THE INVENTION

1. Field of the Invention

The present invention relates to a single-ended sense amplifier circuit amplifying a signal read out from a memory cell and transmitted through a bit line, and to a semiconductor memory device having the single-ended amplifier circuit.

2. Description of Related Art

As capacity of semiconductor memory devices such as a DRAM has recently become large, it has become difficult to obtain a sufficient capacitance value of a capacitor included in a memory cell for the purpose of miniaturization of the memory cell. A charge transfer type sense amplifier circuit is conventionally known as a sense amplifier circuit suitable for amplifying a minute signal voltage readout from the memory cell. For example, configurations of a variety of charge transfer type sense amplifiers are disclosed in the following Patent References 1 to 4.

Patent Reference 1: Japanese Patent Application Laid-open No. 2000-195268
Patent Reference 2: Japanese Patent Application Laid-open No. 2002-157885
Patent Reference 3: Japanese Patent Application Laid-open No. H11-16384
Patent Reference 4: Japanese Patent Application Laid-open No. 2007-73121

FIG. 23 shows a configuration example of a conventional typical charge transfer type sense amplifier circuit. In FIG. 23, there are shown a memory cell MC composed of an N-type selection transistor Q0 and a capacitor Cs, two N-type MOS transistors Qg and Qp, and a latch type differential amplifier 100. The selection transistor Q0 has a source connected to a bit line BL, and a gate connected to a word line WL. The capacitor Cs is connected between the drain of the selection transistor Q0 and a ground potential. The MOS transistor Qg switches connection between the bit line BL and a sense node Ns in response to a control voltage Vg inputted to the gate of the MOS transistor Qg. The MOS transistor Qp switches connection between a power supply voltage VDD and the sense node Ns in response to a control signal SET inputted to the gate of the MOS transistor Qp. The latch type differential amplifier 100 receives a signal voltage at the sense node Ns and a reference voltage Vr respectively, and amplifies a difference therebetween and latches it. In addition, the reference voltage Vr is set to an intermediate voltage of the both voltages at the sense node Ns in reading out high and low level data from the memory cell MC.

In FIG. 23, a bit line capacitance Cb is formed at the bit line BL and a capacitance Ca is formed at the sense node Ns. It has been found from the study of the inventor that operation modes assumed in a sense amplifier circuit are determined depending on parameters such as the capacitance Cs of the capacitor, the potential of the bit line BL and the bit line capacitance Cb, and the potential of the sense node Ns and the capacitance Ca (refer to FIG. 1 and description thereof), and that the sense amplifier circuit is operated in accordance with later-mentioned formulas 1 to 3. It has been confirmed that a charge transfer mode is dominant in the conventional charge transfer type sense amplifier circuit shown in FIG. 23 among the above-mentioned operation modes.

However, when using the charge transfer type sense amplifier circuit of FIG. 23, it is inevitable that the capacitance Ca at the sense node Ns increases since the large-scale latch type differential amplifier 100 is employed. For example, in a configuration including 512 memory cells MC on one bit line BL, it is assumed that the capacitance Ca=10 fF at the sense node Ns is obtained for the bit line capacitance Cb=50 fF. As a result of the study of the inventor under such a condition, it has been found that the amplifying operation of the sense amplifier circuit is not hindered when the power supply voltage VDD is relatively high (for example, 3V or 2V), however, the amplifying operation is hindered when lowering the power supply voltage VDD, for example, an operation under VDD=1V (refer to FIGS. 5 and 6 and descriptions thereof). Under this condition, the voltage difference at the sense node Ns in reading out high and low level data from the memory cell MC becomes reduced, and sufficient operating margin cannot be obtained. Further, it has been found that such a tendency becomes further pronounced when using the capacitor Cs having a smaller capacitance to miniaturize the memory cell MC. As described above, the conventional charge transfer type sense amplifier circuit has a problem in that it is difficult to apply to the configuration achieving the lower voltage operation using memory cells MC having a small capacitance.

SUMMARY

The present invention seeks to solve one or more of the above problems and provides a sense amplifier circuit capable of obtaining a sufficient operating margin in a read operation by appropriately controlling an amplifying operation in a charge distributing mode, in case of achieving low voltage operation in a semiconductor memory device employing memory cells each including a capacitor having a small capacitance.

An aspect of the invention is a sense amplifier circuit of a single-ended type amplifying a signal which is read out from a memory cell and is transmitted through a bit line, comprising: a first MOS transistor supplying a predetermined voltage to the bit line and switching connection between the bit line and a sense node in response to a control voltage applied to a gate thereof; a second MOS transistor having a gate connected to the sense node and amplifying a signal transmitted from the bit line via the first MOS transistor, a first voltage setting circuit setting the bit line to a first voltage in response to a first control signal; and a second voltage setting circuit setting the sense node to a second voltage in response to a second control signal, wherein after the bit line is set to the first voltage and the sense node is set to the second voltage, the bit line is driven in a charge distributing mode via the first MOS transistor so that a signal voltage at the sense node is amplified by the second MOS transistor.

According to the sense amplifier circuit of the aspect, in a read operation of the memory cell, the bit line is set to the first voltage by the first voltage setting circuit, and the sense node is set to the second voltage by the second voltage setting circuit. Subsequently, the first MOS transistor functions as a charge transfer gate, thereby the bit line is driven in the charge distributing mode, and the signal voltage is amplified by the second MOS transistor connected to the sense node. Thus, by setting the first and second voltages to appropriate values respectively, a sufficient voltage difference between the high and low level data read out from the memory cell can be obtained. Also, since the employment of the single-ended sense amplifier circuit allows the capacitance at the sense node to be reduced, a configuration advantageous for improving operating margin particularly in a low voltage operation can be achieved when memory cells having small capacitance are employed.

Particularly the sense amplifier circuit of the aspect is effectively applied to a hierarchical memory cell array. That is, in a configuration in which a predetermined number of local bit lines are selectively connected to the global bit line via the local sense amplifier, the circuit scale can be smaller by using the single-ended local sense amplifier without employing a differential configuration, and sufficient operating margin of the sense amplifier circuit can be obtained.

Further, particularly the sense amplifier circuit of the aspect is effectively combined with a compensated voltage generating circuit generating a compensated voltage of which fluctuation of a threshold voltage of the first or second MOS transistor is compensated. By supplying such a compensated voltage to the sense amplifier circuit, the above-mentioned operating margin can be further improved.

As described above, according to the invention, when the single-ended sense amplifier is employed in which amplifying operation is controlled based on the charge distributing mode, since the capacitance at the sense node can be small, sufficient operating margin in a low voltage operation of about 1V can be obtained. Particularly, an advantageous configuration can be achieved when performing a low voltage operation of about 1V using memory cells having a small capacitance of under about 5 fF.

Further, in a semiconductor memory device having a hierarchical bit line structure and a hierarchical sense amplifier circuit, the capacitance at each local bit line can be set to a small value, an area of the single-ended local sense amplifier can be reduced, and excellent operating margin can be obtained with a small area.

Furthermore, fluctuation of the threshold voltage of the MOS transistor due to manufacturing process and temperature can be appropriately compensated by using the compensated voltage generating circuit. Therefore, the operating margin for sensing can be further improved, thereby improving reliability of the operation of the sense amplifier circuit. Or, since the variation permissible range in the chip can be expanded, when large number of sense amplifier circuits can be implemented in a large capacity DRAM using memory cells having small capacitance, it is possible to improve production yield and to reduce manufacturing cost.

BRIEF DESCRIPTION OF THE DRAWINGS

The above featured and advantages of the invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the invention and that the invention is not limited to the embodiments illustrated for explanatory purposes. In the following, embodiments will be described, in which the invention is applied to a semiconductor memory device having a sense amplifier circuit.

[Basic Principle]

Figure 1:
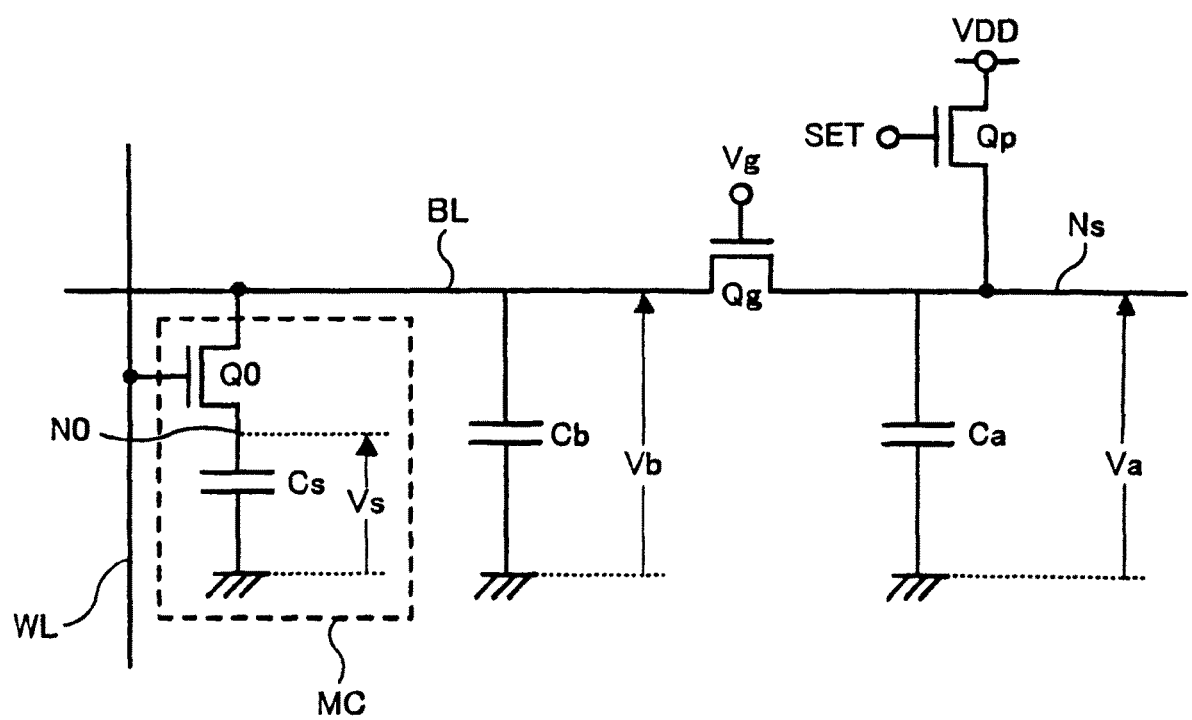
FIG. 1 is a diagram for explaining basic operating principle of a sense amplifier circuit of embodiments.

Basic operating principle of a sense amplifier circuit of the embodiments will be described with reference to FIGS. 1 and 2. Generally, a charge transfer mode and a charge distributing mode can be assumed as basic operation modes of the sense amplifier circuit. FIG. 1 shows diagrams schematically showing a configuration of an input side of the sense amplifier circuit operating in the charge transfer mode and the charge distributing mode. In FIG. 1, there are shown a memory cell MC composed of an N-type selection transistor Q0 and a capacitor Cs, and a sense amplifier circuit including two N-type MOS transistors Qg and Qp.

The selection transistor Q0 has a source connected to a bit line BL, and a gate connected to a word line WL. Further, the capacitor Cs is connected between the drain of the selection transistor Q0 and a ground potential. The MOS transistor Qg functioning as a charge transfer gate is connected between the bit line BL and a sense node Ns. The MOS transistor Qp for supplying the bit line potential is connected between a power supply voltage VDD and the sense node Ns. A control voltage Vg is applied to the gate of the MOS transistor Qg, and a control signal SET is applied to the gate of the MOS transistor Qp. In FIG. 1, a bit line capacitance Cb formed at the bit line BL, a capacitance Ca formed at the sense node Ns, a voltage Vb at the bit line BL, and a voltage Va at the sense node Ns are respectively shown. Among these, the bit line capacitance Cb and the capacitance Ca at the sense node Ns are determined depending on parasitic capacitance of lines, input capacitance of transistors, the number of connected memory cells MC, or the like.

The sense node Ns is set to the power supply voltage VDD by the operation of the MOS transistor Qp for supplying the bit line potential before a read operation of the memory cell MC. At this point, the voltage Vb (the predetermined voltage of the invention) satisfying Vb=Vg−Vt1 based on the control voltage Vg and a threshold voltage Vt1 of the MOS transistor Qg is supplied to the bit line BL via the MOS transistor Qg.

Thereafter, the MOS transistor Qp is turned off, and subsequently the word line WL is driven so that the selection transistor Q0 is turned on. Thereby, the sensing operation of the sense amplifier circuit is started. When a voltage at a charge accumulation node N0 of the memory cell MC is assumed to be Vs, there can be following three operations in accordance with relations between values of Vs, Vb and VDD.

(1) The MOS transistor Qg is maintained off.
(2) Electric charge is transferred via the MOS transistor Qg in the above-mentioned charge transfer mode.
(3) Electric charge is transferred via the MOS transistor Qg in the above-mentioned charge distributing mode.

Here, the voltage Vb corresponding to a boundary (changing point) between the operation (2) and the operation (3) is defined as Vc. By using this voltage Vc, the voltage Va at the sense node Ns after the above operation is completed can be represented as following formulas 1, 2 and 3 respectively corresponding to the operations (1), (2) and (3).

$$Vb \leq Vs: Va=VDD \quad \text{(formula 1)}$$

$$Vs<Vb \leq Vc: Va=VDD+(Cs/Ca)Vs-(Cs/Ca)Vb \quad \text{(formula 2)}$$

$$Vc<Vb: Va=(CsVs+CaVDD)/(Cs+Cb+Ca)+(Cb/(Cs+Cb+Ca))Vb \quad \text{(formula 3)}$$

Here, the voltage Vc is calculated according to a following equation.

$$Vc=((Cs+Cb)CaVDD)+(Cs+Cb)CsVs)/(Cs(Cs+Cb+Ca)+CbCa)$$

Figure 23:
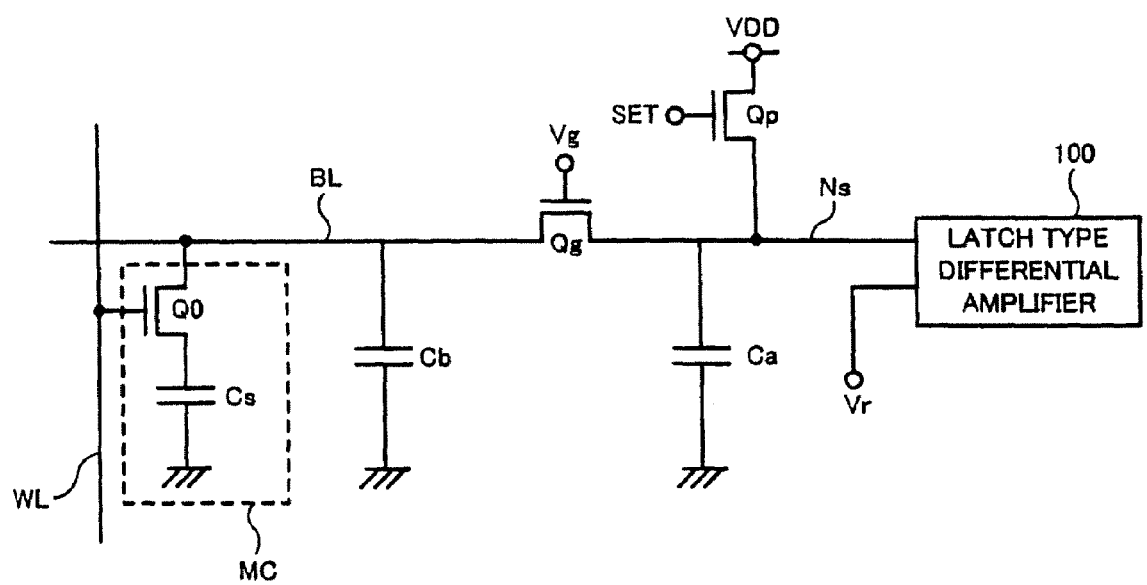
FIG. 23 is a diagram showing a configuration example of a conventional typical charge transfer type sense amplifier circuit.

For example, the conventional sense amplifier shown in FIG. 23 is mainly operated in the charge transfer mode of the above formula 2. However, the sense amplifier circuit shown in FIG. 1 is operated by controlling the charge transfer mode and the charge distributing mode.

Figure 2:
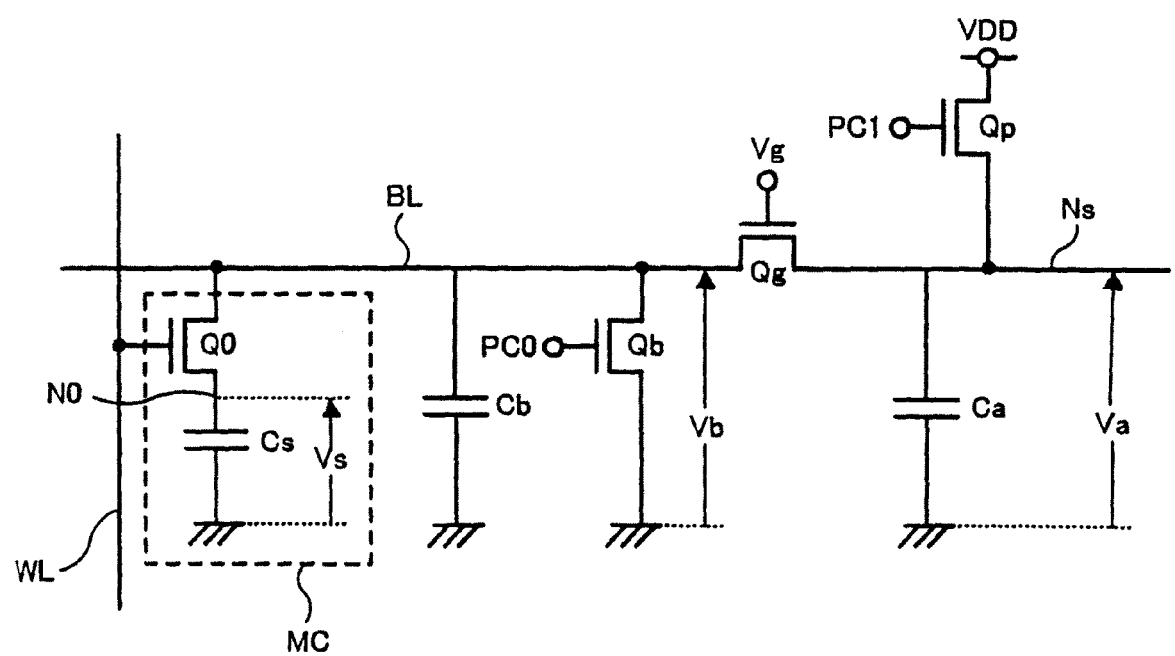
FIG. 2 is a diagram for explaining basic operating principle regarding a sense amplifier circuit operating in a charge distributing mode in the embodiments.

FIG. 2 schematically shows a configuration of an input side of the sense amplifier circuit operating in the charge distributing mode. In FIG. 2, an N-type MOS transistor Qb connected between the bit line BL and the ground potential is provided, in addition to the memory cell MC and the N-type MOS transistors Qg and Qp like in FIG. 1. The MOS transistor Qb sets the bit line BL to the ground potential in response to a precharge signal PC0 inputted to the gate. In addition, a precharge signal PC1 is applied to the gate of the MOS transistor Qp. Other parts in FIG. 1 are common to those in FIG. 1, so description thereof will be omitted.

In a precharge operation, the MOS transistor Qg is controlled to be turned off. In this case, the bit line BL is precharged to the ground potential by the operation of the MOS transistor Qb, and the sense node Ns is precharged to the power supply voltage VDD by the operation of the MOS transistor Qp. After turning off the MOS transistors Qp and Qb to complete the precharge operation, the word line WL is driven to turn on the selection transistor Q0. Thereby, a sensing operation of the sense amplifier circuit is started. Here, a relation between the above voltage Vs and the voltage Vb which is obtained when electric charge of the memory cell MC is read out to the bit line BL to complete the charge distributing is represented as follows:

$$Vb=(Cs/(Cs+Cb))Vs$$

At this point, the MOS transistor Qg is maintained off. Then, the operation in the charge distributing mode is started, the control voltage Vg is applied to the gate of the MOS transistor Qg. Here, a voltage Vx is defined using the threshold voltage Vt1 of the MOS transistor Qg by the following formula:

$$Vx=Vg-Vt1$$

Here, there can be the above-mentioned three operations (1), (2) and (3) in accordance with relations between values of Vs, Vb and VDD. Then, the above voltage Vc which is a boundary between the operations (2) and (3) is represented as follows:

$$Vc=(CsVs+CaVDD)/(Cs+Cb+Ca)$$

Thereby, the voltage Va at the sense node Ns after the completion of the operation in the charge distributing mode is represented as following formulas 1', 2' and 3' respectively corresponding to the operations (1), (2) and (3).

$$Vx \leq Vb: Va=VDD \quad \text{(formula 1')}$$

$$Vs<Vx \leq Vc: Va=VDD+(Cs/Ca)Vs-((Cs+Cb)/Ca)Vx \quad \text{(formula 2')}$$

$$Vc<Vx: Va=(CsVs+CaVDD)/(Cs+Cb+Ca) \quad \text{(formula 3')}$$

In the sense amplifier circuit of the embodiments, by appropriately setting the control voltage Vg, the operation is performed according to formula 1' when high level data is read out from the memory cell MC, and the operation is performed according to formula 3' when low level data is read out from the memory cell MC, as described below. In this manner, since the sense amplifier circuit of the embodiments is controlled to mainly operate in the charge distributing mode while hardly using the charge transfer mode, the sense amplifier circuit of the embodiments can be referred to as a "charge distributing control type sense amplifier circuit".

First Embodiment

Figure 3:
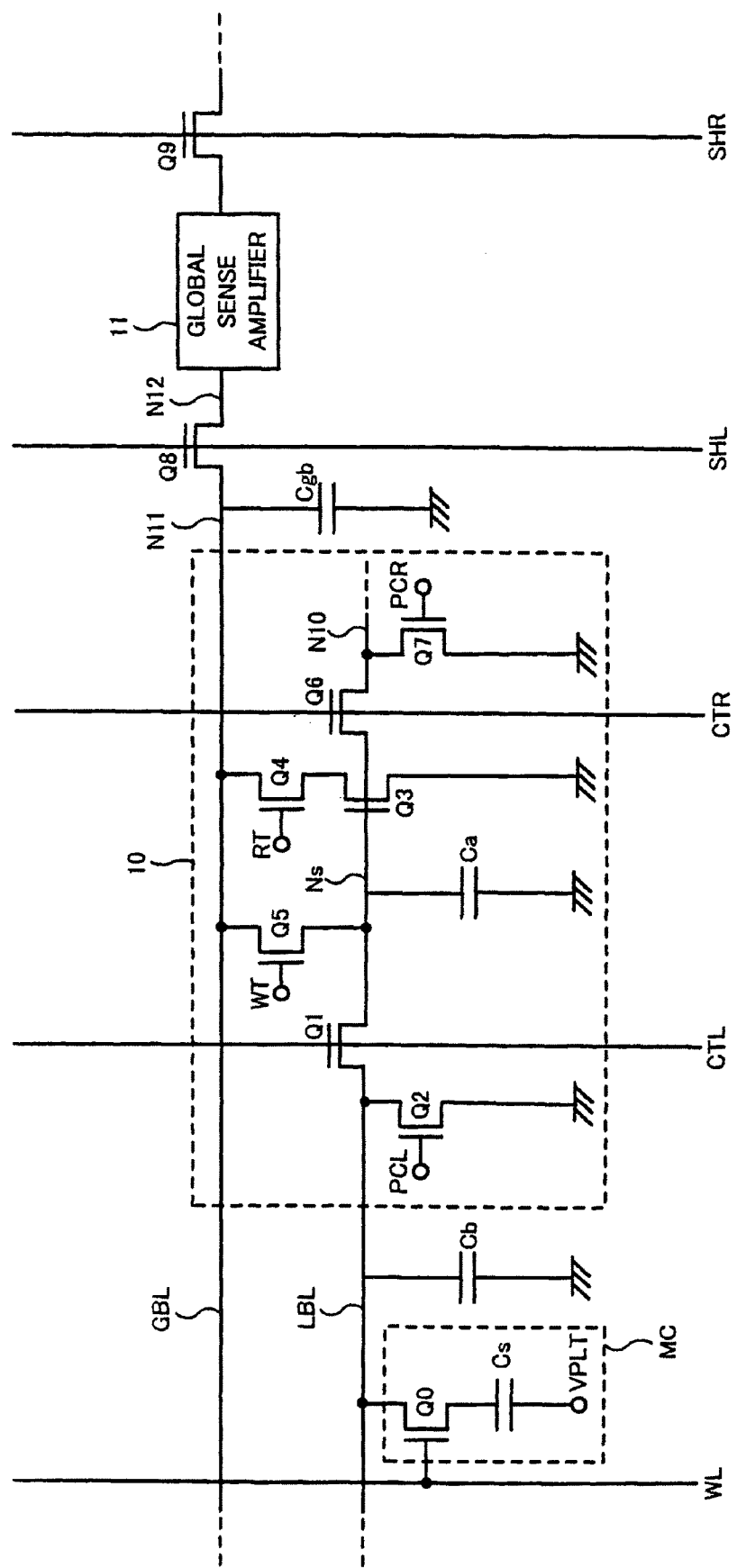
FIG. 3 is a diagram showing a configuration example of a sensing part in a DRAM of a first embodiment.

A first embodiment of the invention will be described below. In the first embodiment, a single-ended charge distributing control type sense amplifier circuit is applied to a DRAM in which a hierarchical memory cell array is configured and both hierarchical bit lines and hierarchical sense amplifier circuits are provided. FIG. 3 shows a configuration example of a sensing part in the DRAM of the first embodiment, in which a memory cell MC, a local bit line LBL (the bit line of the invention) and a global bit line GBL which serve as part of the hierarchical bit lines, a local sense amplifier 10 as the above-mentioned charge distributing control type sense amplifier circuit, and a global sense amplifier 11 are shown.

The memory cell MC is a 1T1C type DRAM memory cell composed of an N-type MOS selection transistor Q0, and a capacitor Cs storing information as electric charge. The selection transistor Q0 has a source connected to the local bit line LBL and a gate connected to the word line WL. The capacitor Cs is connected between the drain of the selection transistor Q0 and a cell plate voltage VPLT. Although FIG. 3 shows one memory cell MC, a large number of memory cells MC arranged at intersections of a plurality of word lines WL and a plurality of local bit lines LBL are practically provided. In the first embodiment, it is assumed that 32 memory cells MC, for example, are connected to one local bit line LBL. In this case, the bit line capacitance Cb totally formed at one local bit line LBL is, for example, 3 fF.

The local bit line LBL connected to the memory cell MC is selectively connected the global bit line GBL via the local sense amplifier 10, and transmitted to the corresponding global sense amplifier 11. Although FIG. 3 shows only part of the configuration, the first embodiment employs the configuration in which each local sense amplifier 10 is shared by local bit lines LBL on both sides and each global sense amplifier 11 is shared by global bit lines GBL on both sides. Thereby, the number of the local sense amplifiers 10 and the number of global sense amplifiers 21 can be reduced so as to reduce the chip area.

The local sense amplifier 10 includes seven N-type MOS transistors Q1, Q2, Q3, Q4, Q5, Q6 and Q7. The MOS transistor Q1 (the first MOS transistor of the invention) functioning as the charge transfer gate is connected between the local bit line LBL and the sense node Ns in the local sense amplifier 10, and a control signal CTL is applied to its gate. The MOS transistor Q2 (the first voltage setting circuit of the invention) corresponding to the MOS transistor Qb of FIG. 2 is connected between the local bit line LBL and the ground potential, and a precharge signal PCL (the first control signal of the invention) is applied to its gate. The MOS transistor Q3 (the second MOS transistor of the invention) functioning as an amplifying element has a gate connected to the sense node Ns, and senses and amplifies the signal transmitted from the local bit line LBL via the MOS transistor Q1 so as to convert the signal into a drain current.

The MOS transistor Q4 for read control switches connection between the global bit line GBL and the drain of the MOS transistor Q3 in response to a control signal RT applied to the gate of the MOS transistor Q4. The MOS transistor Q5 (the second voltage setting circuit of the invention) for write control switches connection between the global bit line GBL and the sense node Ns in response to a control signal WT (the second control signal of the invention) applied to its gate.

Since one local sense amplifier 20 is shared by two local bit lines LBL, MOS transistors Q6 and Q7 connected to the local bit line LBL on one side (node N10) are provided, in addition to the MOS transistors Q1 and Q2 connected to the local bit line LBL on the other side. A control signal CTR is applied to the gate of the MOS transistor Q6 corresponding to the MOS transistor Q1, and a precharge signal PCR is applied to the gate of the MOS transistor Q7 corresponding to the MOS transistor Q2. The local sense amplifier 10 can be selectively connected to either of the local bit lines LBL on both sides. In addition, 64 memory cells MC in total are connected to the local sense amplifier 10 through the two local bit lines LBL on the both sides.

Further, for example, eight local sense amplifiers 10 are connected to one global bit line GBL. In this case, 512 memory cells MC in total can be selectively connected to one global bit line GBL. A parasitic capacitance Cgb is formed at each global bit line GBL. There are provided a MOS transistor Q8 switching connection to one global bit line GBL and a MOS transistor Q9 switching connection to the other global bit line GBL, on both sides of the global sense amplifier 11. Then, the global sense amplifier 11 can be selectively connected to either of the global bit lines GBL on both sides by using a control signal SHL applied to the gate of the MOS transistor Q8 and a control signal SHR applied to the gate of the MOS transistor Q9.

Figure 4:
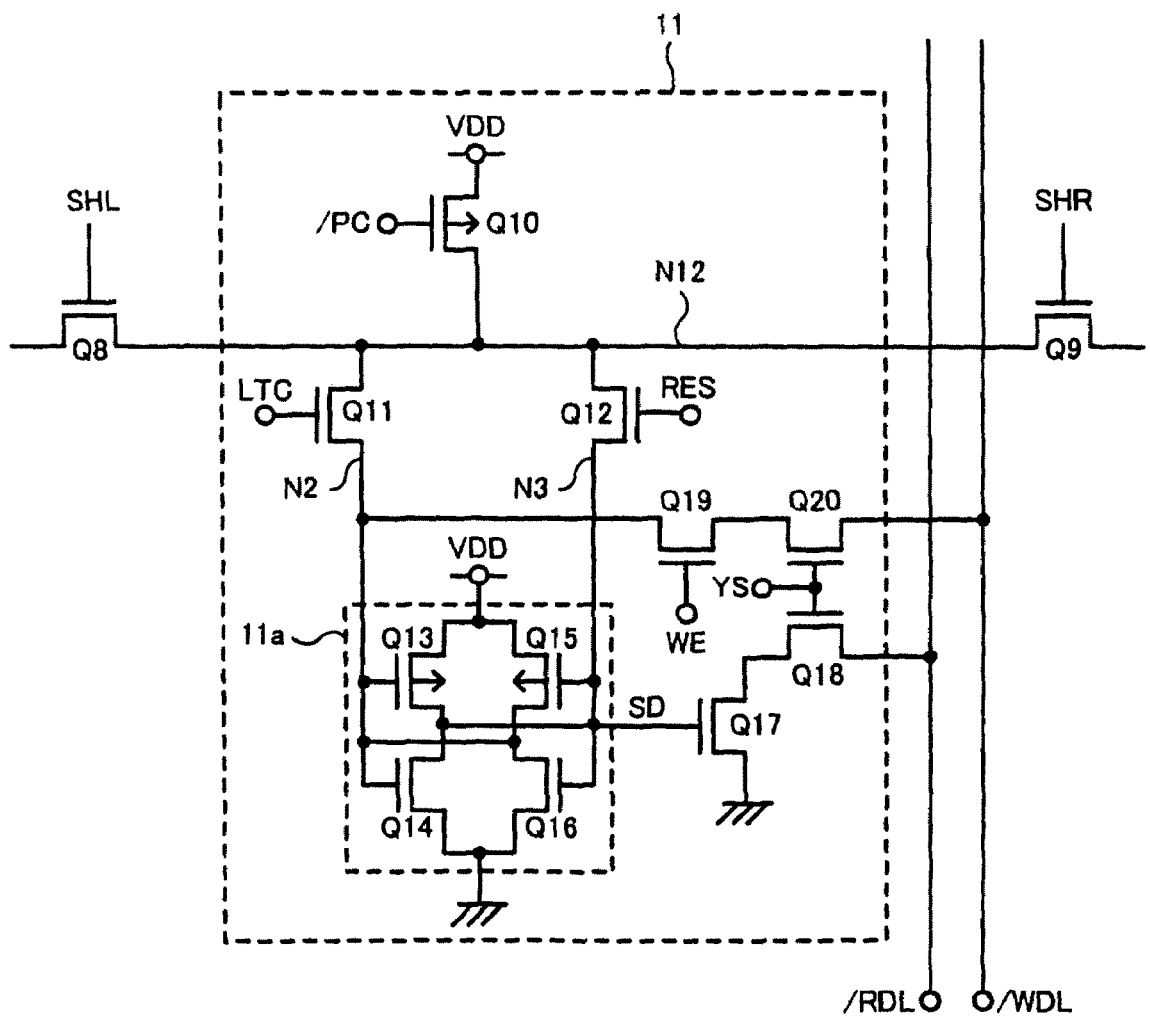
FIG. 4 is a diagram showing an example of a circuit configuration of a global sense amplifier of FIG. 3.

FIG. 4 shows an example of a circuit configuration of the global sense amplifier 11 of FIG. 3. As shown in FIG. 4, the global sense amplifier 11 includes three P-type MOS transistors Q10, Q13 and Q15, and eight N-type MOS transistors Q11, Q12, Q14, Q16 to Q20. The MOS transistor Q10 for precharging is connected between the power supply voltage VDD and a node N12. The MOS transistor Q10 precharges the node N12 to the power supply voltage VDD when an inverted precharge signal /PC applied to the gate is low. The MOS transistor Q11 switches connection between the node N12 and a node N2 in response to a control signal LTC applied to its gate. Further, the MOS transistor Q12 switches connection between the node N12 and a node N3 in response to a control signal RES applied to its gate.

A signal voltage decision latch 11a includes four MOS transistors Q13 to Q16 and determines a binary level of a signal transmitted from the local sense amplifier 10 to the node N12 so as to latch the signal. In the signal voltage decision latch 11a, a pair of MOS transistors Q13 and Q14 having gates connected to the node N2 forms a sensing inverter having relatively large driving force. Similarly, a pair of MOS transistors Q15 and Q16 having gates connected to the node N3 forms a latching inverter having relatively small driving force.

Two MOS transistors Q17 and Q18 are connected in series as a read circuit between a read bus/RDL and the ground, and an output signal SD (node N3) of the signal voltage decision latch 11a is inputted to the gate of the MOS transistor Q17. Two MOS transistors Q19 and Q20 are connected in series as a write circuit between a write bus/WDL and the node N2, and a write enable signal WE is inputted to the gate of the MOS transistor Q19. A sense amplifier selection signal YS is commonly inputted to the gates of the MOS transistors Q18 and Q20.

In a read operation, the latch control signal LTC becomes high and the sense amplifier selection signal YS becomes high, and the output signal SD of the sensing inverter is outputted to the read bus/RDL. At this point, the output signal SD appearing at the node N3 has a voltage obtained by inverting the logic value at the node N12. In a rewrite operation performed for avoiding destruction of data of memory cells MC after the read operation, the latch control signal LTC becomes low, the control signal RES becomes high, and the output signal SD is outputted to the node N12 via the NMOS transistor Q12.

Meanwhile, in a write operation, the sense amplifier selection signal YS becomes high, the write enable signal WE becomes high, and write data is inputted through the write bus/WDL. The write data is inverted by the sensing inverter, and outputted to the node N12 via the MOS transistor Q12.

Figure 5A:
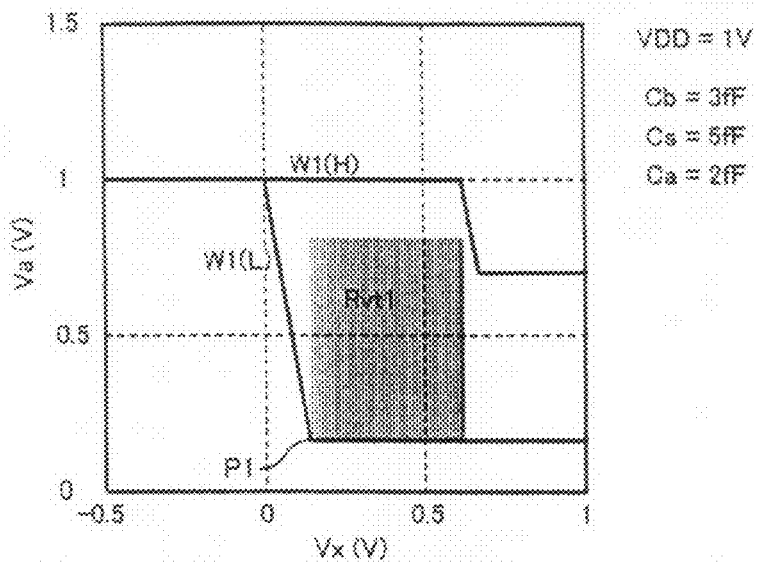
FIGS. 5A and 5B are diagrams for explaining an amplifying operation of the sense amplifier circuit of the first embodiment.
Figure 5B:
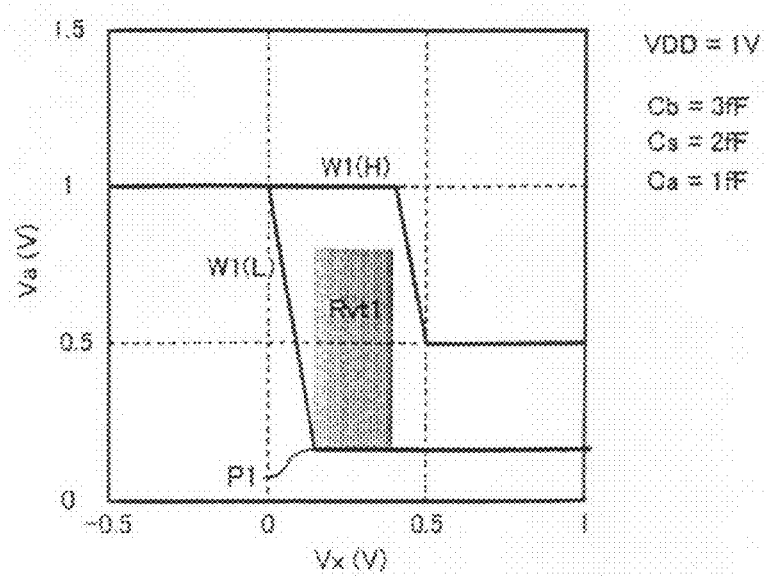

Next, an amplifying operation of the sense amplifier circuit of the first embodiment will be descried using FIGS. 5A and 5B. FIGS. 5A and 5B show two graphs corresponding to two conditions of capacitances for the purpose of explaining the amplifying operation of the sense amplifier circuit of the first embodiment. In each graph, the power supply voltage VDD=1V is assumed, a characteristic W1(H) represents a characteristic when reading high level data from the memory cell MC (Vs=1V), and a characteristic W1(L) represents a characteristic when reading low level data from the memory cell MC (Vs=0V). In addition, the voltage Vs is a voltage of the capacitor Cs at the charge accumulation node N0 (FIG. 2). Further, regarding the bit line capacitance Cb, the capacitance of the capacitor Cs (Hereinafter referred to simply as "capacitance Cs") of the memory cell MC and the capacitance Ca at the sense node Ns, settings in FIG. 5A are Cb=3 fF, Cs=5 fF and Ca=2 fF, and settings in FIG. 5B are Cb=3 fF, Cs=2 fF and Ca=1 fF.

In FIGS. 5A and 5B, a variation range of a threshold voltage of the MOS transistor Q3 is, for example, from 0.3 to 0.8V. Thus, an operation area where the voltage Va of the longitudinal axis remains at 1V is used for the characteristic W1(H) in reading high level data in order that the MOS transistor Q3 remains on. The voltage Va remains at 1V according to the above formula 1' in this operation area. Meanwhile, an operation area where the voltage Va is under 0.3V, for example, is used for the characteristic W1(L) in reading low level data in order that the MOS transistor Q3 is turned off. At this point, in the characteristic W1(L), the voltage Va rapidly changes and reaches a changing point P1 when the voltage Vx of the horizontal axis exceeds 0V, and an operation is performed in accordance with the charge distributing mode in an area over the changing point P1 as shown in the above formula 3'. In each graph, a range within which the signal voltage can be read out is determined by a voltage difference between the characteristics W1(H) and W1(L).

Each of FIGS. 5A and 5B also shows a setting example of a variation permissible range Rvt1 for the threshold voltage in the local sense amplifier 10. A width along the longitudinal axis of the variation permissible range Rvt1 indicates a variation permissible range of a threshold voltage Vt3 of the MOS transistor Q3, and a width along the horizontal axis of the variation permissible range Rvt1 indicates a variation permissible range of a threshold voltage Vt1 of the MOS transistor Q1. In addition, the voltage Vx is set to a voltage lower than the constant control voltage Vg of the MOS transistor Q1 by the threshold voltage Vt1 of the MOS transistor Q1. It is a condition for a stable amplifying operation by the local sense amplifier 10 that the variation permissible range Rvt1 entirely exists within an area surrounded by the characteristics W1(H) and W1(L). In this case, the larger the variation permissible range Rvt1 in the area surrounded by the characteristics W1(H) and W1(L), the larger the operating margin of the local sense amplifier 10 so as to improve the reliability of the amplifying operation.

Figure 6:
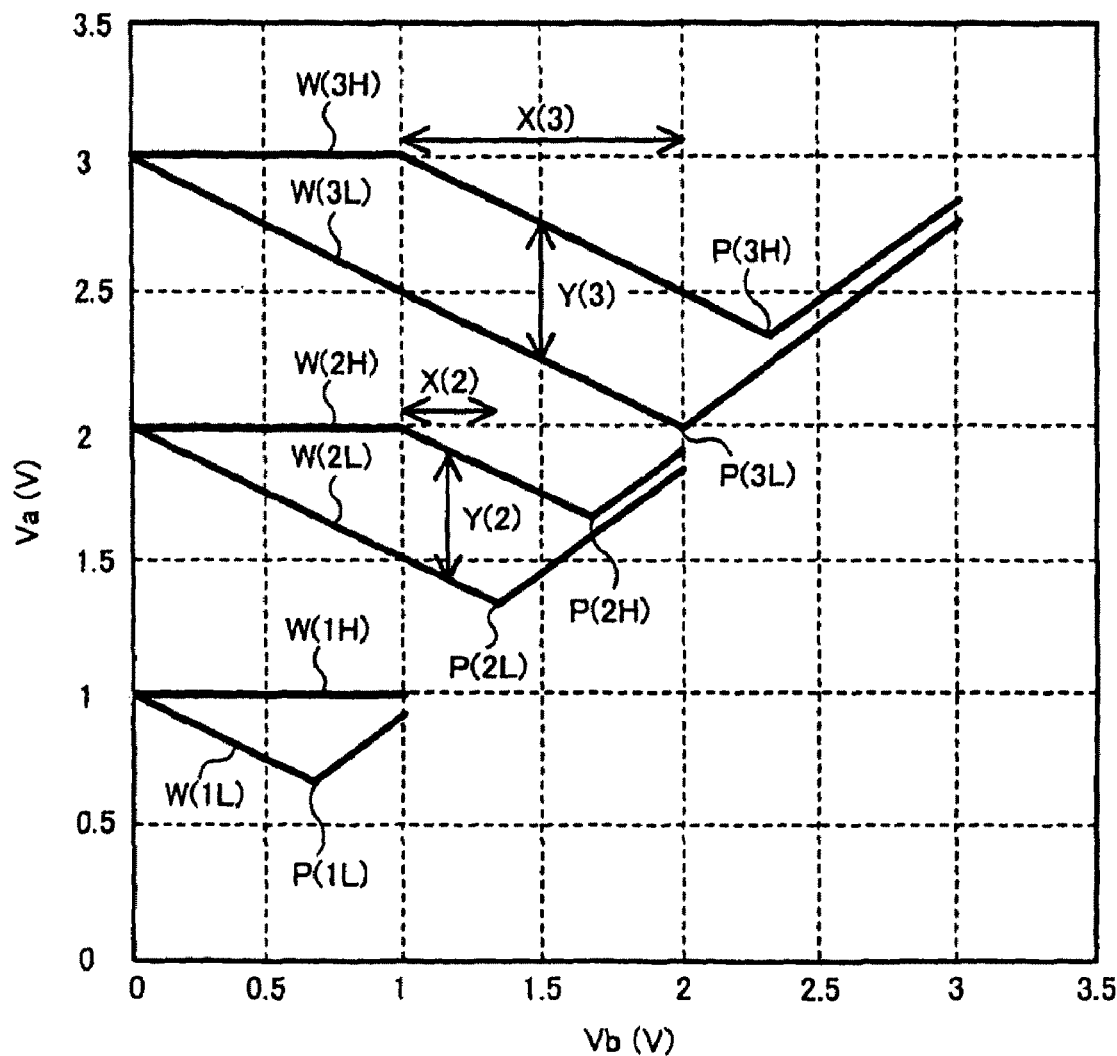
FIG. 6 is a diagram showing a first comparison example corresponding to the amplifying operation of the conventional sense amplifier circuit.
Figure 7:
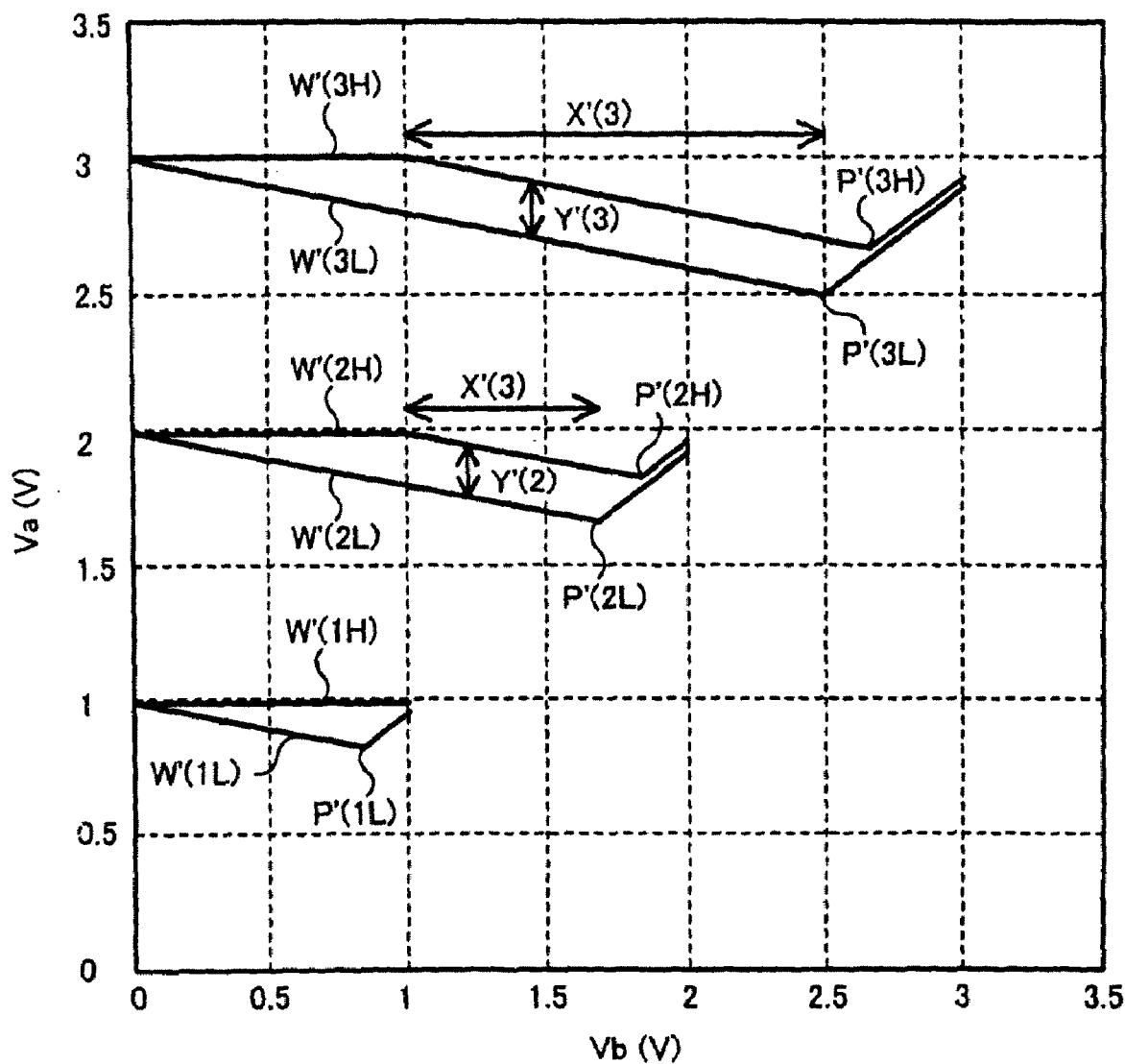
FIG. 7 is a diagram showing a second comparison example corresponding to the amplifying operation of the conventional sense amplifier circuit.

Here, FIGS. 6 and 7 show two graphs corresponding to the amplifying operation of the conventional sense amplifier circuit (FIG. 23) as a comparison example of FIGS. 5A and 5B. In each of FIGS. 6 and 7, the power supply voltage VDD is assumed to be operated under 3V, and characteristics in reading high/low level data are shown for three conditions of voltages VDD=3V, 2V, 1V. Further, Cs=5 fF is set in FIG. 6 corresponding to FIG. 5A, and Cs=2 fF is set in FIG. 7 corresponding to FIG. 5B. Also, Cb=50 fF and Ca=10 fF are set in both FIGS. 6 and 7. In FIG. 6, values (3, 2, 1) of VDD, high level data (H) and low level data (L) are denoted with parentheses for respective values of the characteristics W, the changing points P, the permissible ranges X and Y along the longitudinal and horizontal axes. Also, the same representations are shown in FIG. 7 for characteristics W', changing points P' and permissible ranges X' and Y' along the longitudinal and horizontal axes. Here, each of X and X' indicates permissible ranges of a set value of the voltage Vb, while each of Y and Y' indicates a difference between read signal voltages of high and low in the permissible ranges X and X'.

In the conventional sense amplifier circuit, positions of the changing points P and P' are shifted to right in a case of the power supply voltage VDD=3V/2V. Here, the difference between read signal voltages is decreased in the case of Cs=2 fF in FIG. 7, in which memory cells having a lower capacitance are employed, relative to the case of Cs=5 fF in FIG. 6. Further, as apparent from FIGS. 6 and 7, it is difficult to obtain the above-mentioned permissible ranges X and Y under a condition of VDD=1V, and it is also difficult to use the conventional sense amplifier circuit in such a low-voltage operation. As described above, the case of FIG. 5 has a remarkable difference in that operating margin is largely improved particularly under the condition of low voltage operation of VDD=1V in comparison with FIGS. 6 and 7. This is mainly an effect due to a reduction in the capacitance Ca at the sense node Ns by employing the single-ended local sense amplifier 10.

Figure 8:
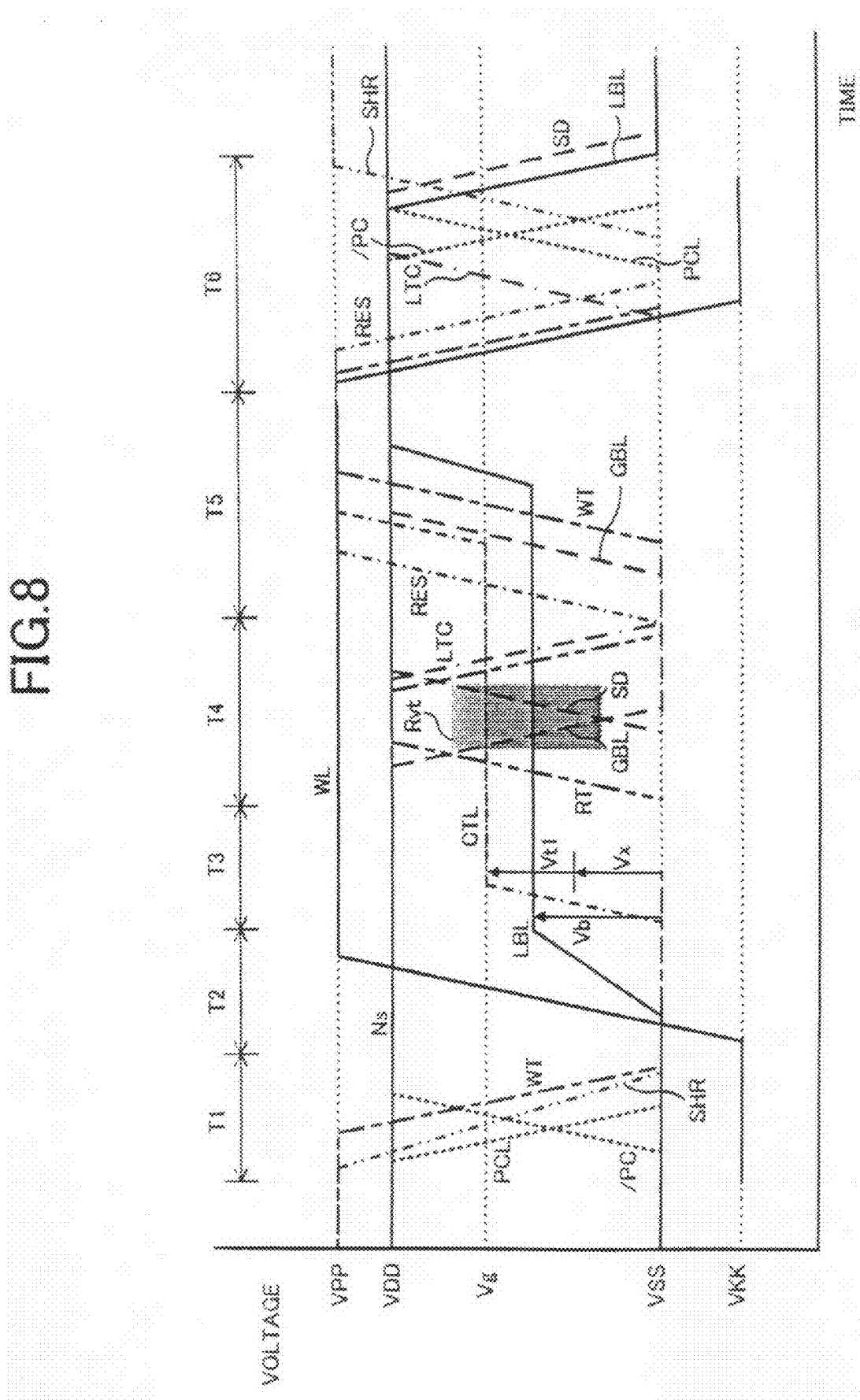
FIG. 8 is a diagram for explaining a read operation in the DRAM of the first embodiment and showing operation waveforms in a case of reading high level data from a memory cell.
Figure 9:
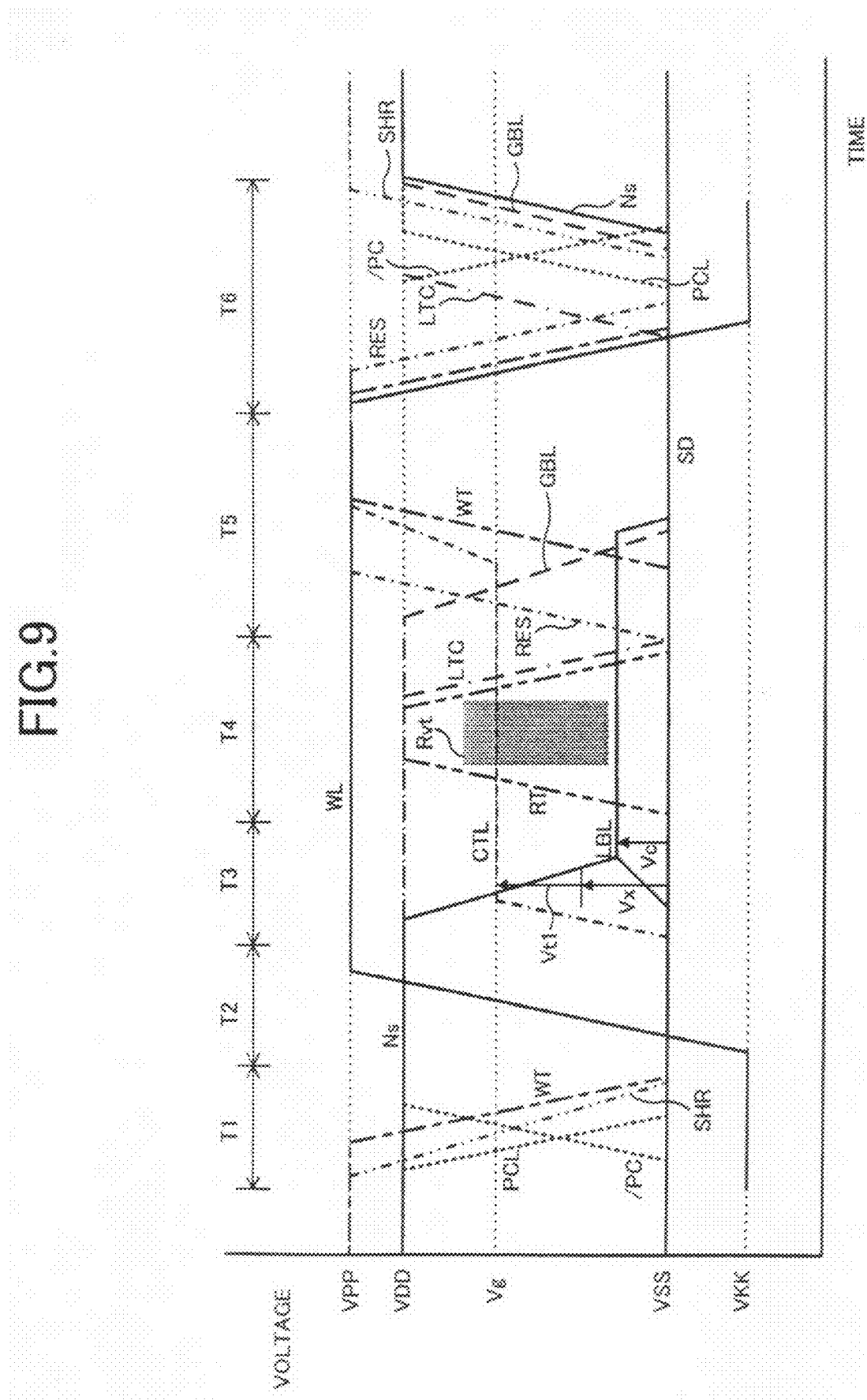
FIG. 9 is a diagram for explaining a read operation in the DRAM of the first embodiment and showing operation waveforms in a case of reading low level data from the memory cell.

Next, a read operation in the DRAM of the first embodiment will be described with reference to FIGS. 8 and 9. FIG. 8 shows operation waveforms in case of reading high level data from the memory cell MC, and FIG. 9 shows operation waveforms in case of reading low level data from the memory cell MC. As shown in upper parts of FIGS. 8 and 9, the entire operation is divided into six terms (T1 to T6).

As shown in FIG. 8, in the read operation of high level data, the local bit line LBL is precharged to the ground potential VSS (0V) and the sense node Ns and the global bit line GBL are precharged to the power supply voltage VDD, respectively before a precharge cancellation term T1. At this point, the precharge signal PC and the latch control signal LTC are respectively high, and the inverted precharge signal /PC and the control signals CTL, CTR, RT and RES are respectively low. Further, the control signals WT, SHL and SHR are at a positive voltage VPP higher than the power supply voltage VDD, and the potential of the word line WL is at a negative voltage VKK lower than the ground potential VSS.

In the precharge cancellation term T1, the precharge signal PCL is controlled to be low so that the MOS transistor Q2 is turned off, and the local bit line LBL on the left side is precharged to the ground potential VSS and becomes floating. At this point, the non-selected local bit line LBL on the right side is maintained in a state of being precharged to the ground potential VSS via the MOS transistor Q7. Further, the control signal WT is controlled to be low so as to turn off the MOS transistor Q5, and the sense node Ns is precharged to the power supply voltage VDD and becomes floating. At this point, the control signal SHR is controlled to be low, and the non-selected global bit line GBL is disconnected from the global sense amplifier 11. Here, in the non-selected local sense amplifier 10, the precharge signals PCL and PCR are maintained high while the control signals CTL, CTR and RT are maintained low, which is not shown in FIG. 8, and the potential of the word line WL is maintained at the negative voltage VKK.

In a cell selection term T2, the word line WL is driven from the negative voltage VKK to the positive voltage VPP, and thus a signal voltage of the memory cell MC maintaining high level is read out to the local bit line LBL. Thereby, the local bit line LBL increases to the voltage Vb.

In a charge distributing term T3, the control signal CTL is controlled to be the controlled voltage Vg. At this point, since the voltage Vx obtained by Vx=Vg−Vt1 is lower than the voltage Vb of the local bit line LBL, the MOS transistor Q1 is maintained off, and the sense node Ns is maintained at the power supply voltage VDD.

In a sense term T4, the control signal RT is controlled to be high and is maintained in this state for a given period. At this point, since the potential of the sense node Ns is higher than the upper limit of the variation permissible range Rvt of the threshold voltage of the MOS transistor Q3, a large drain current flows through the MOS transistor Q3. Accordingly, electric charge which is charged in the parasitic capacitance Cgb at the global bit line GBL is extracted in a short time by the MOS transistor Q3, and thus the global bit line GBL is rapidly discharged so that its potential changes from the power supply voltage VDD to the ground potential VSS. The potential of the global bit line GBL reaches the ground potential VSS at the end of the sense term T4 and is inverted by the signal voltage decision latch 11a of the global sense amplifier 11 so that the output signal SD changes to the power supply voltage VDD. Thereafter, the latch control signal LTC is controlled to be low, and the sense term T4 is finished.

In addition, the variation permissible range Rvt of the threshold voltage of the MOS transistor Q3 is determined depending on a range in which an entire variation distributed, for example, depending on a minute variation in dimension when forming transistors, variation in thickness of a gate insulating film, a random fluctuation in channel impurity distribution, or the temperature.

Subsequently, in a restore term T5, the control signal RES is controlled to be the positive voltage VPP, the output signal SD of the global sense amplifier 11 is outputted to the global bit line GBL via the MOS transistor Q12, and the potential of the global bit line GBL changes to the power supply voltage VDD. Subsequently, the control signal WT is again controlled to be the positive voltage VPP, and the global bit line GBL is connected to the sense node Ns via the MOS transistor Q5. Then, the control signal CTL maintained at the control voltage Vg is controlled to be the positive voltage VPP at the approximately same timing, and the local bit line LBL is connected to the sense node Ns via the MOS transistor Q1. Thereby, high level data is rewritten into the memory cell MC.

In a precharge term T6, the word line WL is returned to the negative voltage VKK. Subsequently, the control signals CTL and RES are controlled to be low, and the latch control signal LTC is controlled to be high. Subsequently, the precharge signal PCL is controlled to be high, the inverted precharge signal /PC is controlled to be low, the local bit line LBL is precharged to the ground potential VSS, and the sense node Ns and the global bit line GBL are precharged to the power supply voltage VDD. Thereby, the output signal SD of the signal voltage decision latch 11a changes to low. Finally, the control signals SHR is controlled to be the positive voltage VPP, and the read operation is completed.

Next, as shown in FIG. 9, the operation before the precharge cancellation term T1 in reading low level data is performed in the same manner as in FIG. 8. In the subsequent cell selection term T2, the word line WL is driven from the negative voltage VKK to the positive voltage VPP, and a signal voltage of the memory cell MC maintaining low level is read out to the local bit line LBL. At this point, the voltage Vb of the local bit line LBL is maintained at the ground potential.

In the charge distributing term T3, the control signal CTL is controlled to be the controlled voltage Vg. At this point, since the above voltage Vx is higher than the voltage Vc, the MOS transistor Q1 is turned on and operates in the charge distributing mode as shown in formula 3'. Thereby, the local bit line LBL and the sense node Ns are at the same potential so that Va=Vc is satisfied.

In the sense term T4, the control signal RT is controlled to be high and is maintained in this state for a given period. At this point, since the potential of the sense node Ns is lower than the lower limit of the variation permissible range Rvt of the threshold voltage Vt of the MOS transistor Q3, the drain current does not flow through the MOS transistor Q3. Thus, the potential of the global bit line GBL is maintained at the power supply voltage VDD. The potential of the global bit line GBL reaches the power supply voltage VDD at the end of the sense term T4, and this potential is inverted by the signal voltage decision latch 11a of the global sense amplifier 11 so that the output signal SD is remained at the ground potential VSS. Thereafter, the latch control signal LTC is controlled to be low, and the sense term T4 is finished.

In the restore term T5, the control signal RES is controlled to be the positive voltage VPP, the output signal SD of the global sense amplifier 11 is outputted to the global bit line GBL via the MOS transistor Q12, and the potential of the global bit line GBL changes to the ground potential VSS. Subsequently, the control signal WT is again controlled to be the positive voltage VPP, and the global bit line GBL is connected to the sense node Ns via the MOS transistor Q5. Then, the control signal CTL maintained at the control voltage Vg is controlled to be the positive voltage VPP at the approximately same timing, and the local bit line LBL is connected to the sense node Ns via the MOS transistor Q1. Thereby, low level data is rewritten into the memory cell MC.

In the precharge term T6, the word line WL is returned to the negative voltage VKK. Subsequently, the control signals CTL and RES are controlled to be low, and the latch control signal LTC is controlled to be high. Subsequently, the precharge signal PCL is controlled to be high, the inverted precharge signal /PC is controlled to be low, the local bit line LBL is precharged to the ground potential VSS, and the sense node Ns and the global bit line GBL are precharged to the power supply voltage VDD. Finally, the control signals SHR is controlled to be the positive voltage VPP, and the read operation is completed.

Figure 10:
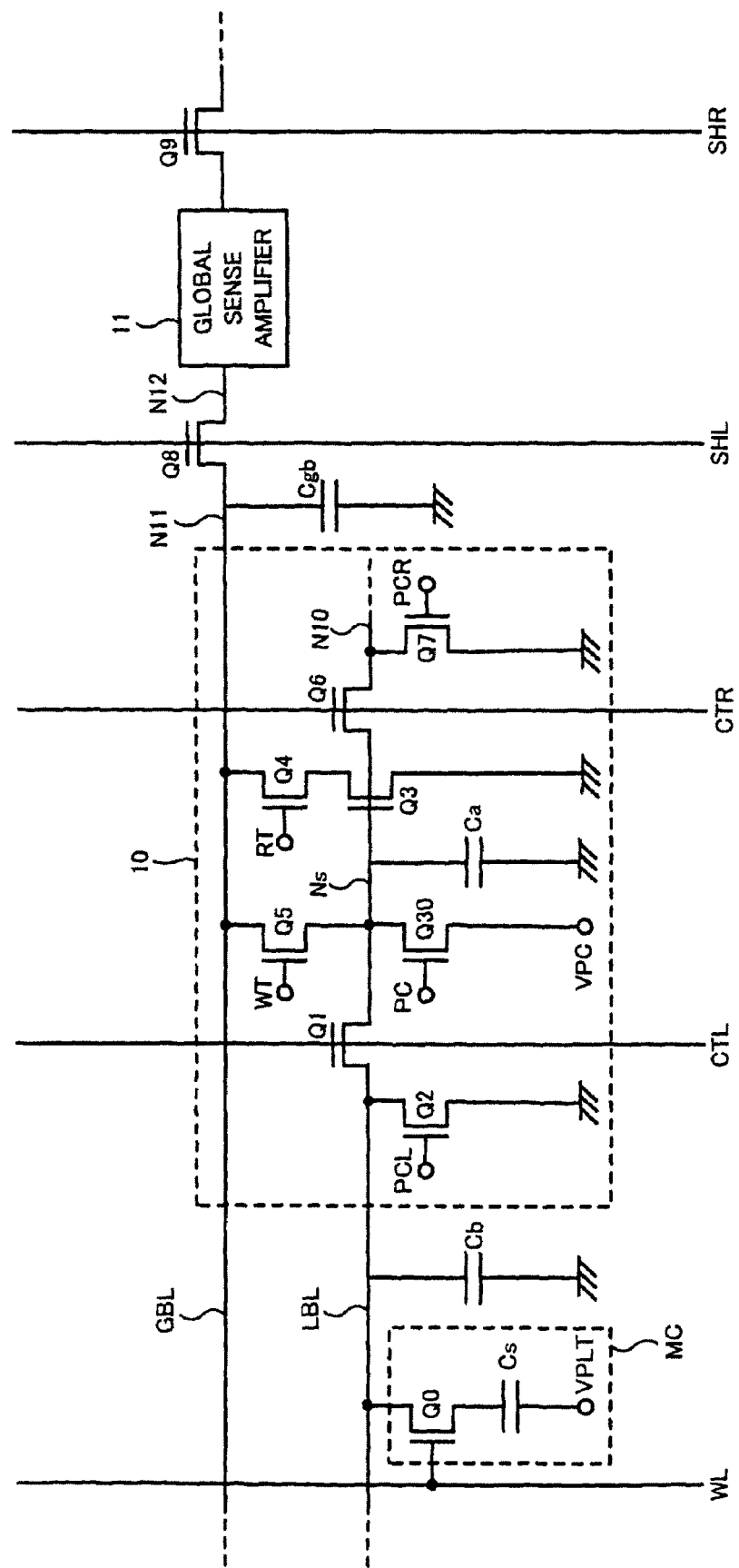
FIG. 10 is a diagram showing a configuration example of a sensing part in a DRAM of a modification of the first embodiment.

Next, a modification of the first embodiment will be described. FIG. 10 shows a configuration obtained by modifying part of the local sense amplifier 10 as the modification of the first embodiment. That is, In FIG. 10, a MOS transistor Q30 is provided between the sense node Ns of the local sense amplifier 10 and a power supply VPC in the circuit configuration like FIG. 3, and the power supply VPC is a predetermined voltage. This predetermined voltage is set to, for example, 1.5V. In addition, other circuit portions in FIG. 10 are common to those in FIG. 3, so description thereof will be omitted.

Figure 11A:
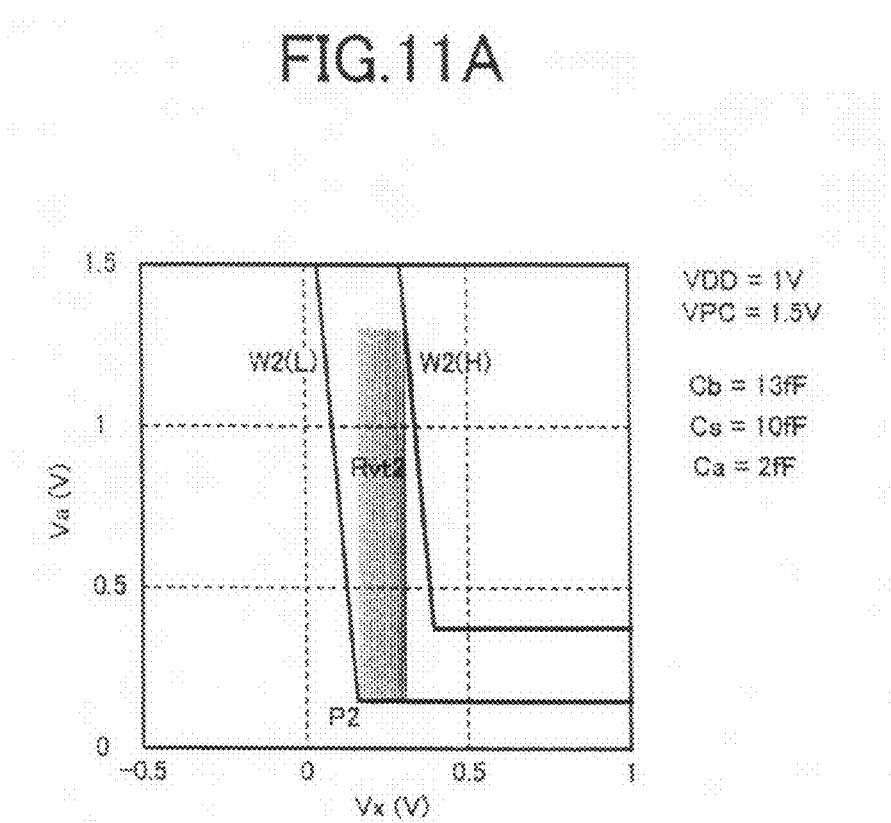
FIGS. 11A and 11B are diagrams for explaining an amplifying operation of the sense amplifier circuit of the modification of the first embodiment.
Figure 11B:
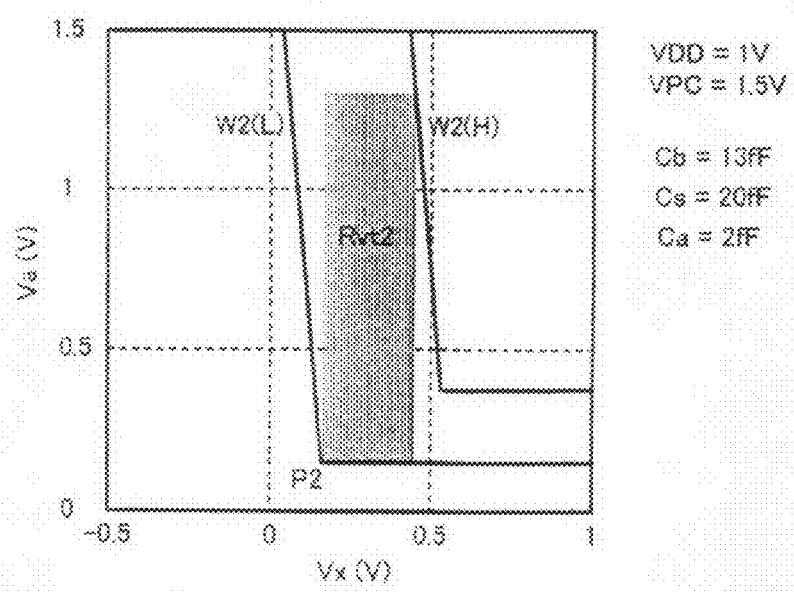

FIGS. 11A and 11B show two graphs in the same manner as in FIGS. 5A and 5B in order to explain the amplification operation of this modification. In each graph, the power supply voltage VDD=1V is assumed like in FIG. 5. Also the above voltage VPC=1.5 V is set, and Cb=13 fF, Cs=10 fF and Ca=2 fF are set in FIG. 11A while Cb=13 fF, Cs=20 fF and Ca=2 fF are set in FIG. 11B. In this case, characteristics W2(H) and W2(L) in FIG. 11A and characteristic W2(H) and W2(L) in FIG. 11B are obtained, and the relation between the voltage Vx and the voltage Va differs from that in FIGS. 5A and 5B reflecting the difference between the above-mentioned parameters. Further, In FIGS. 11A and 11B, it is understood that the variation permissible range Rvt2 is distributed in a relatively wide range.

Figure 12:
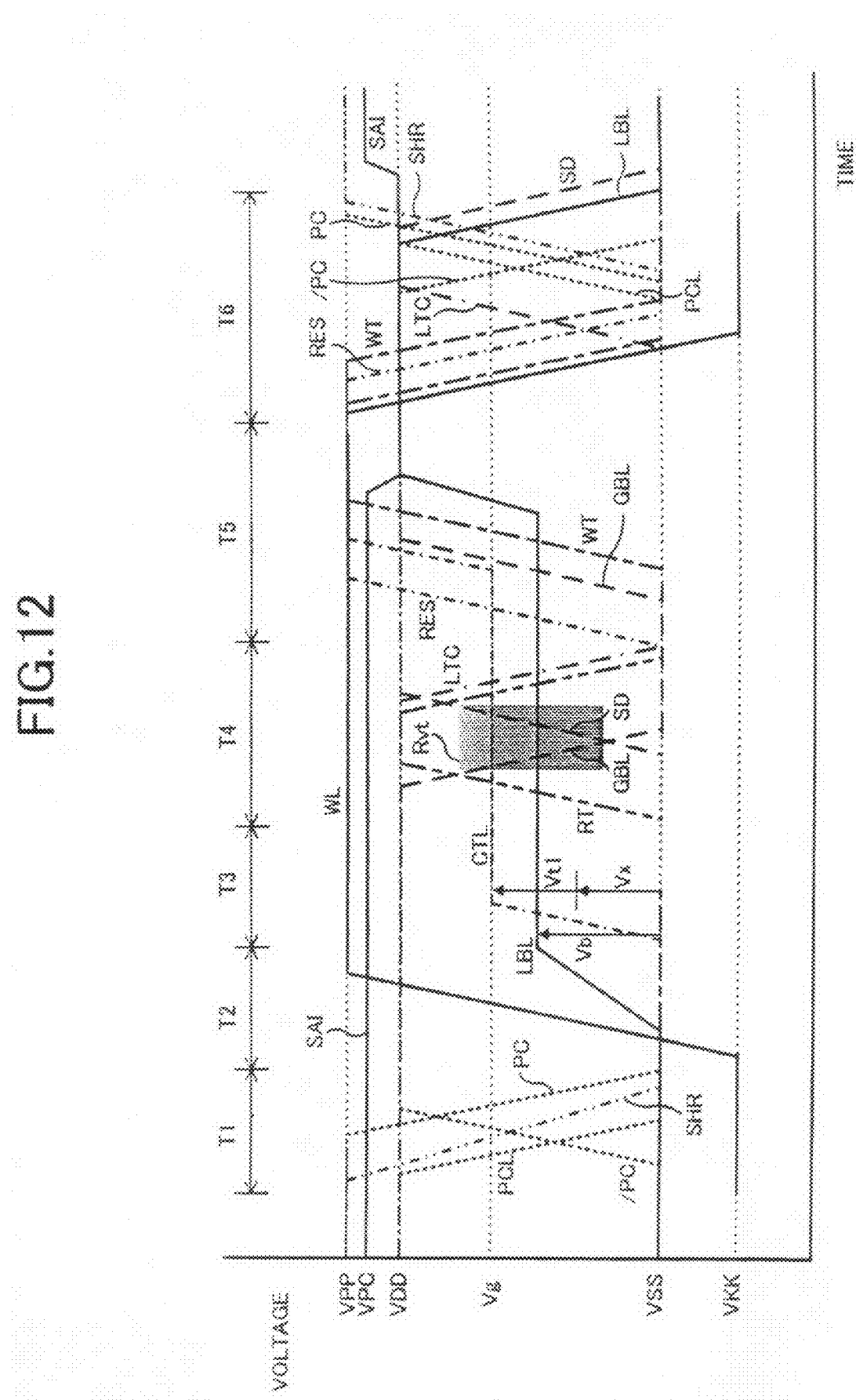
FIG. 12 is a diagram for explaining a read operation in the DRAM of the modification of the first embodiment and showing operation waveforms in a case of reading high level data from a memory cell.
Figure 13:
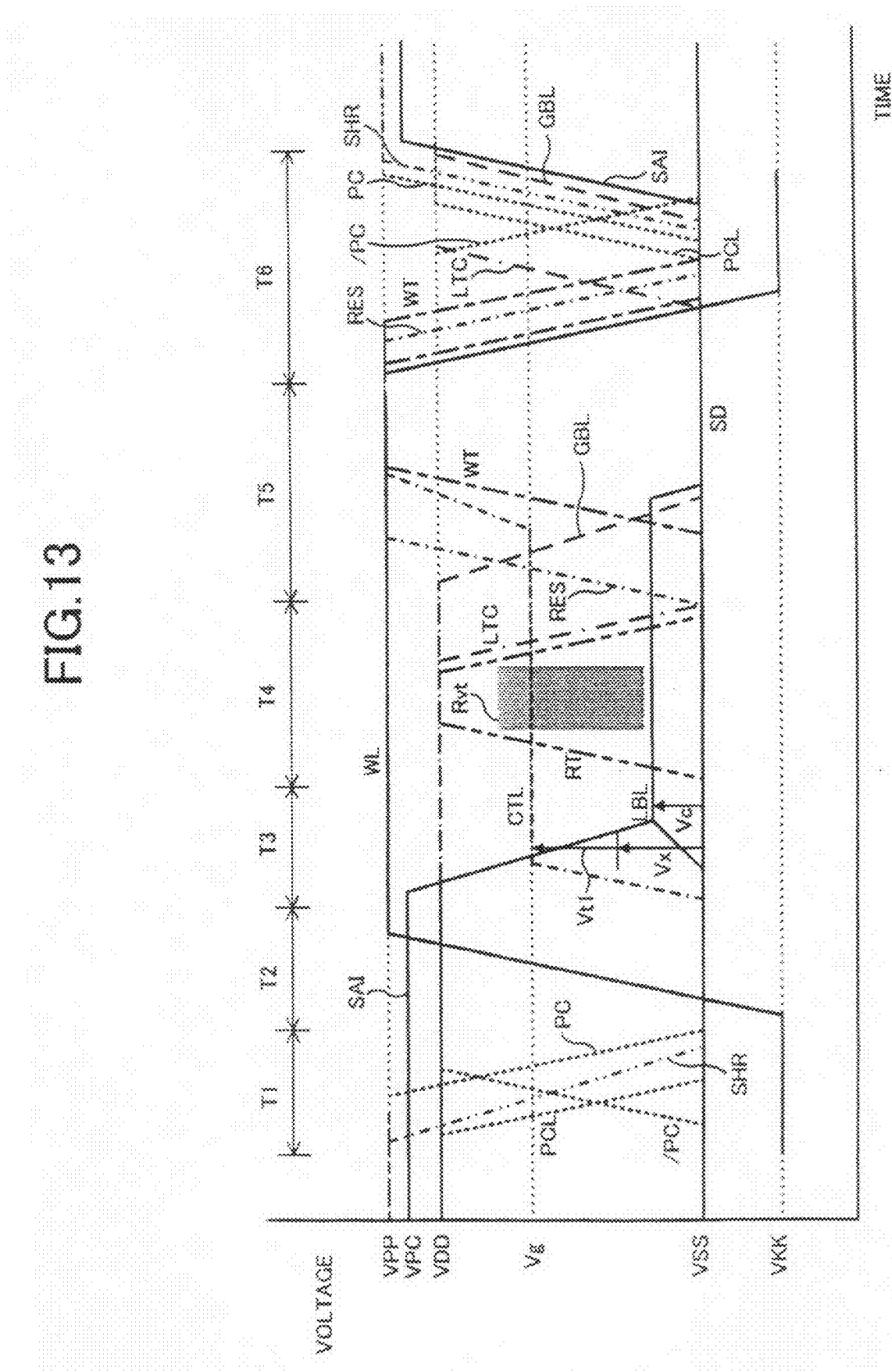
FIG. 13 is a diagram for explaining a read operation in the DRAM of the modification of the first embodiment and showing operation waveforms in a case of reading low level data from the memory cell.

FIGS. 12 and 13 are diagrams for explaining a read operation in the DRAM of this modification, and show operation waveforms corresponding to FIGS. 8 and 9. Since many of the operation waveforms in FIGS. 12 and 13 are common to those in FIGS. 8 and 9, only differences therebetween will be described below. In this modification, the precharge signal PC is controlled to be high in the precharge operation, and the potential of the sense node Ns increases to the voltage VPC via the MOS transistor Q30. As shown in FIGS. 12 and 13, an increase in the voltage Va at the sense node Ns results in an effect of expanding the variation permissible range Rvt of the threshold voltage.

Second Embodiment

Next, a second embodiment of the invention will be described. A DRAM of the second embodiment has hierarchical bit lines and sense amplifier circuits in the same manner as the first embodiment, and components therein are almost common to those in the first embodiment, however, certain power source circuits are modified. That is, a compensated voltage generating circuit which compensates fluctuation of the threshold voltage Vt1 of the MOS transistor Q1 and a compensated voltage generating circuit which compensates fluctuation of the threshold voltage Vt3 of the MOS transistor Q3 are employed. Specific configurations thereof will be described below.

Figure 14:
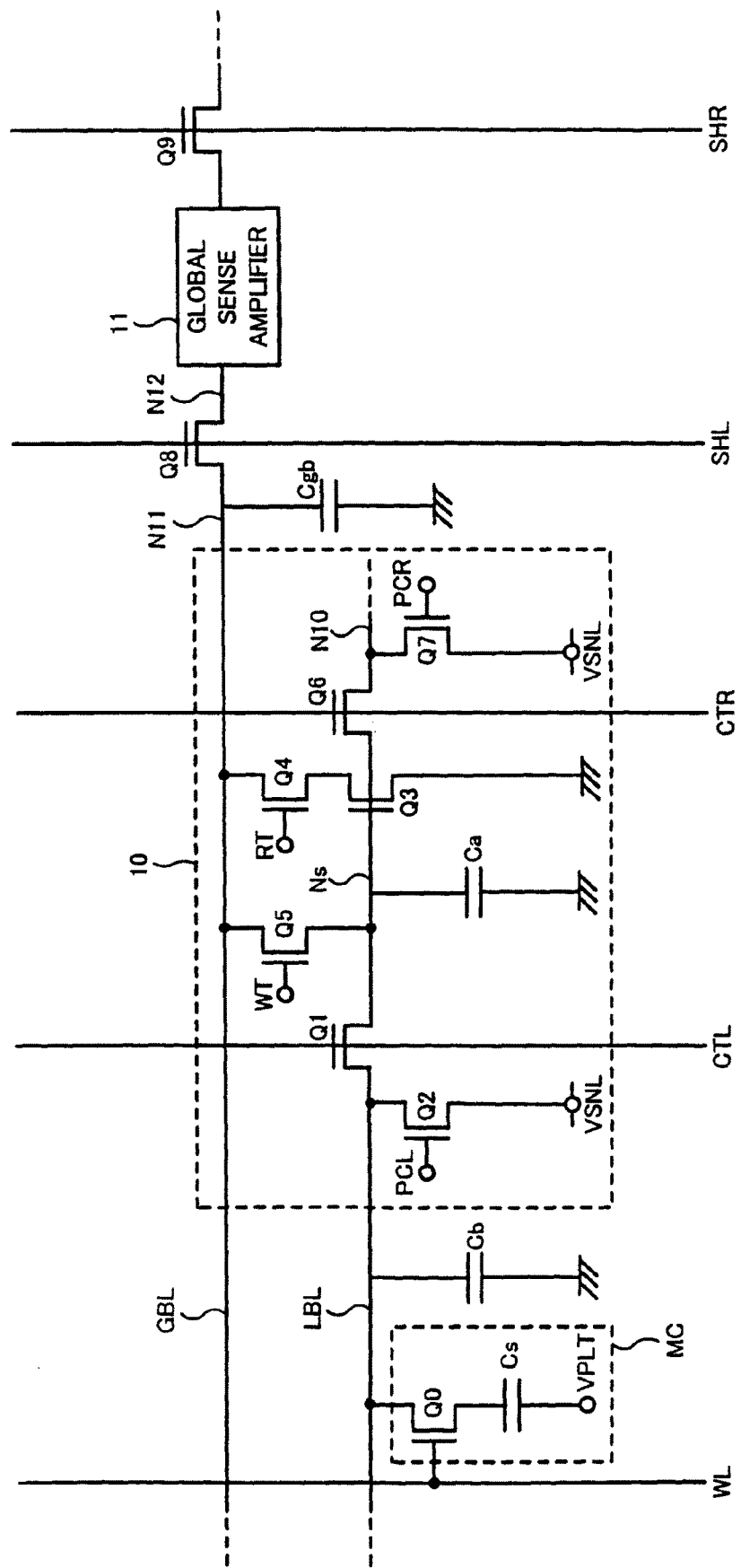
FIG. 14 is a diagram showing a configuration example of a sensing part in a DRAM of a second embodiment.
Figure 15:
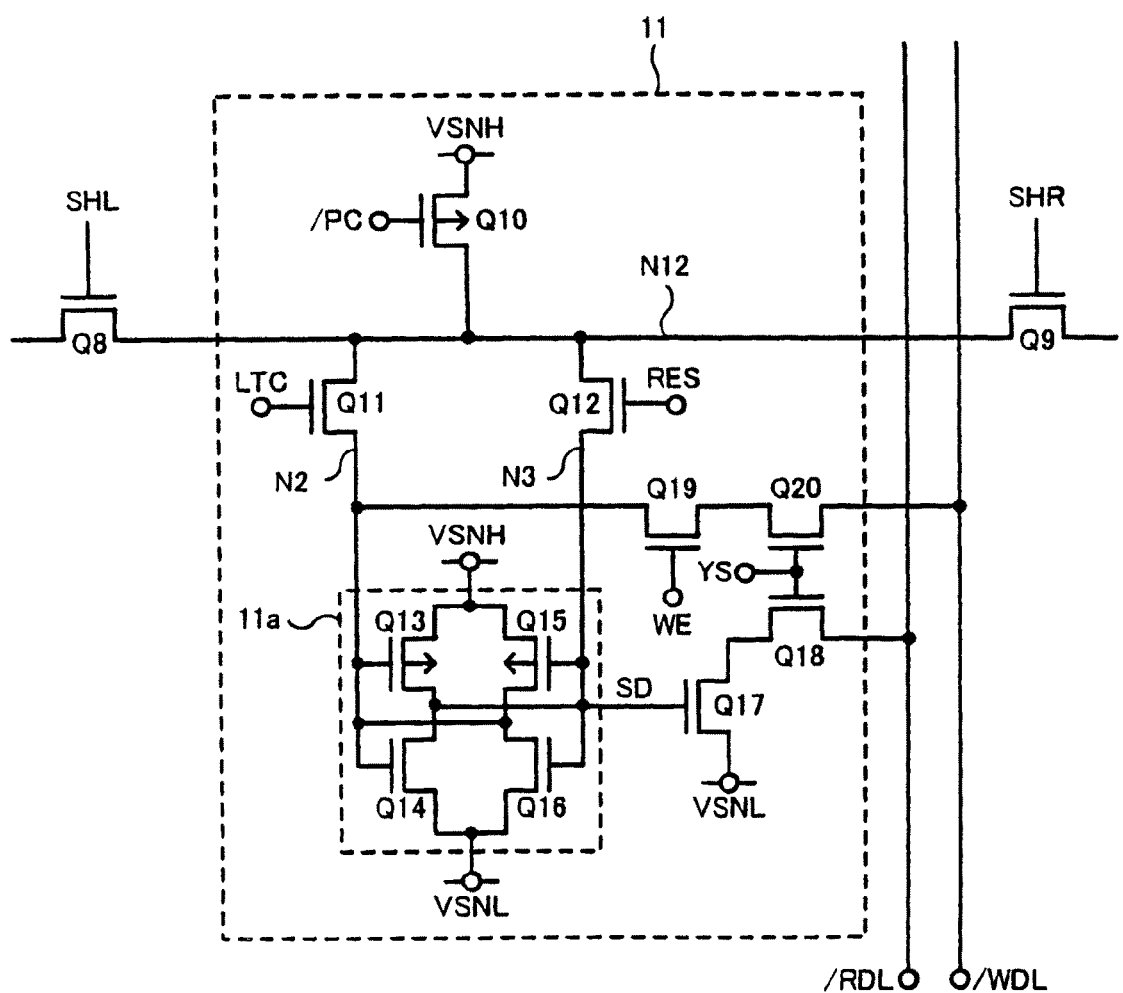
FIG. 15 is a diagram showing an example of a circuit configuration of the global sense amplifier of FIG. 14.

FIG. 14 shows a configuration example of a sensing part in the DRAM of the second embodiment, which corresponds to FIG. 3 of the first embodiment. FIG. 15 shows an example of a circuit configuration of the global sense amplifier 11 of FIG. 14. The basic circuit configuration in FIGS. 14 and 15 is almost common to FIGS. 3 and 4 of the first embodiment, in which however a difference exists in the power source circuits as mentioned above. That is, the ground potential supplied to sources of the MOS transistors Q2 and Q7 is replaced with a voltage VSNL in the local sense amplifier 10. Further, the power supply voltage VDD supplied to the source of the MOS transistor Q10 and the signal voltage decision latch 11a is replaced with a voltage VSNH, and the ground potential supplied to the source of the MOS transistor Q17 and the signal voltage decision latch 11a is replaced with the voltage VSNL, respectively in the global sense amplifier 11. The compensated voltage generating circuits having the configuration described later are used in order to generate the voltages VSNH and VSNL.

Figure 16:
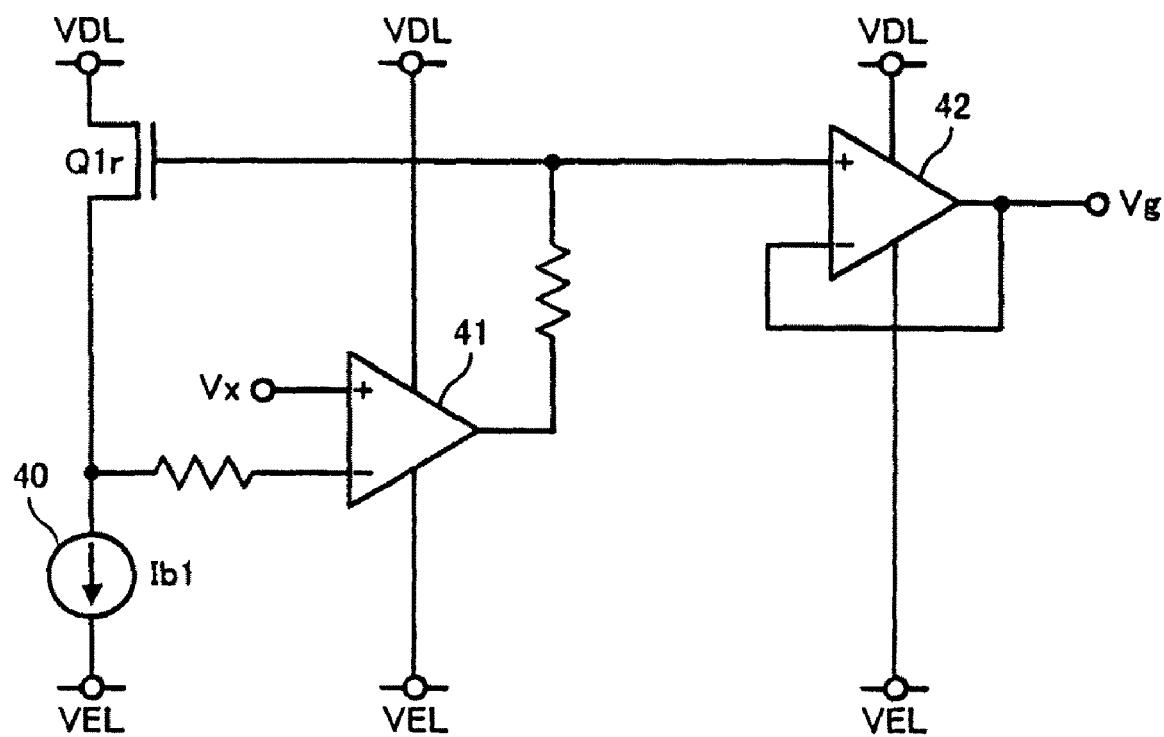
FIG. 16 is a diagram showing a circuit configuration example of a control voltage generating circuit functioning as a compensated voltage generating circuit of the second embodiment.

FIG. 16 shows a circuit configuration example of a control voltage generating circuit functioning as the above compensated voltage generating circuit of the second embodiment. This control voltage generating circuit is a feedback type power supply generating circuit generating a control voltage Vg in which the fluctuation of the threshold voltage Vt1 of the MOS transistor Q1 is compensated, and is used for the purpose of, for example, applying a high voltage of the control signal CTL to the gate of the MOS transistor Q1. As shown in FIG. 16, the control voltage generating circuit includes a replica MOS transistor Q1r, a constant current source 40, and two operational amplifiers 41 and 42. Further, a positive voltage VDL and a negative voltage VEL are used as a pair of constant voltage power supplies, the positive voltage VDL is supplied to the replica MOS transistor Q1r and to the operational amplifiers 41 and 42, and the negative voltage VEL is supplied to one end of the constant current source 40 and to the operational amplifiers 41 and 42.

In FIG. 16, the replica MOS transistor Q1r functions as a replica transistor of the MOS transistor Q1 of the local sense amplifier 10 (FIG. 3), and formed in the same shape and size as the MOS transistor Q1. A drain current equal to a constant current Ib1 flowing in the constant current source 40 connected to the source of the replica MOS transistor Q1r flows in the replica MOS transistor Q1r. The operational amplifier 41 receives a source voltage of the replica MOS transistor Q1r at a minus-side input terminal via a resistor, and receives the voltage Vx at a plus-side input terminal. An output voltage of the operational amplifier 41 is inputted to the gate of the replica MOS transistor Q1r via a resistor. In this case, feedback control is performed so that the output voltage of the operational amplifier 41 matches a value obtained by adding the voltage Vx to the threshold voltage Vt1 of the replica MOS transistor Q1r. Meanwhile, the subsequent operational amplifier 42 receiving the output voltage of the operational amplifier 41 forms a voltage follower to strengthen current driving ability, and outputs the control voltage Vg equal to Vx+Vt1.

The control voltage Vg outputted from the control voltage generating circuit of FIG. 16 is applied to the gate of the MOS transistor Q1 in the sensing operation. With the fluctuation of the threshold voltage Vt1 of the MOS transistor Q1 in the configuration of FIG. 3, the voltage Vx of the local bit line LBL given by Vx=Vg−Vt1 fluctuates. Meanwhile, in the second embodiment, since the control voltage generating circuit of FIG. 16 generates the control voltage Vg in which the threshold voltage Vt1 is compensated, the value of the voltage Vx is always maintained constant even when the threshold voltage Vt of MOS transistors fluctuates due to manufacturing process and temperature. Accordingly, actual variations can be small enough relative to the variation permissible range Rvt of the threshold voltage in FIG. 5 or 11, thereby further improving the operating margin of the sense amplifier circuit. By employing the control voltage generating circuit of FIG. 16, a variation factor actually existing is becomes restrictive, which is based on a difference between characteristics of the MOS transistor Q1 and the replica MOS transistor Q1r, thereby reliably enabling the compensation of the manufacturing process or temperature.

Figure 17:
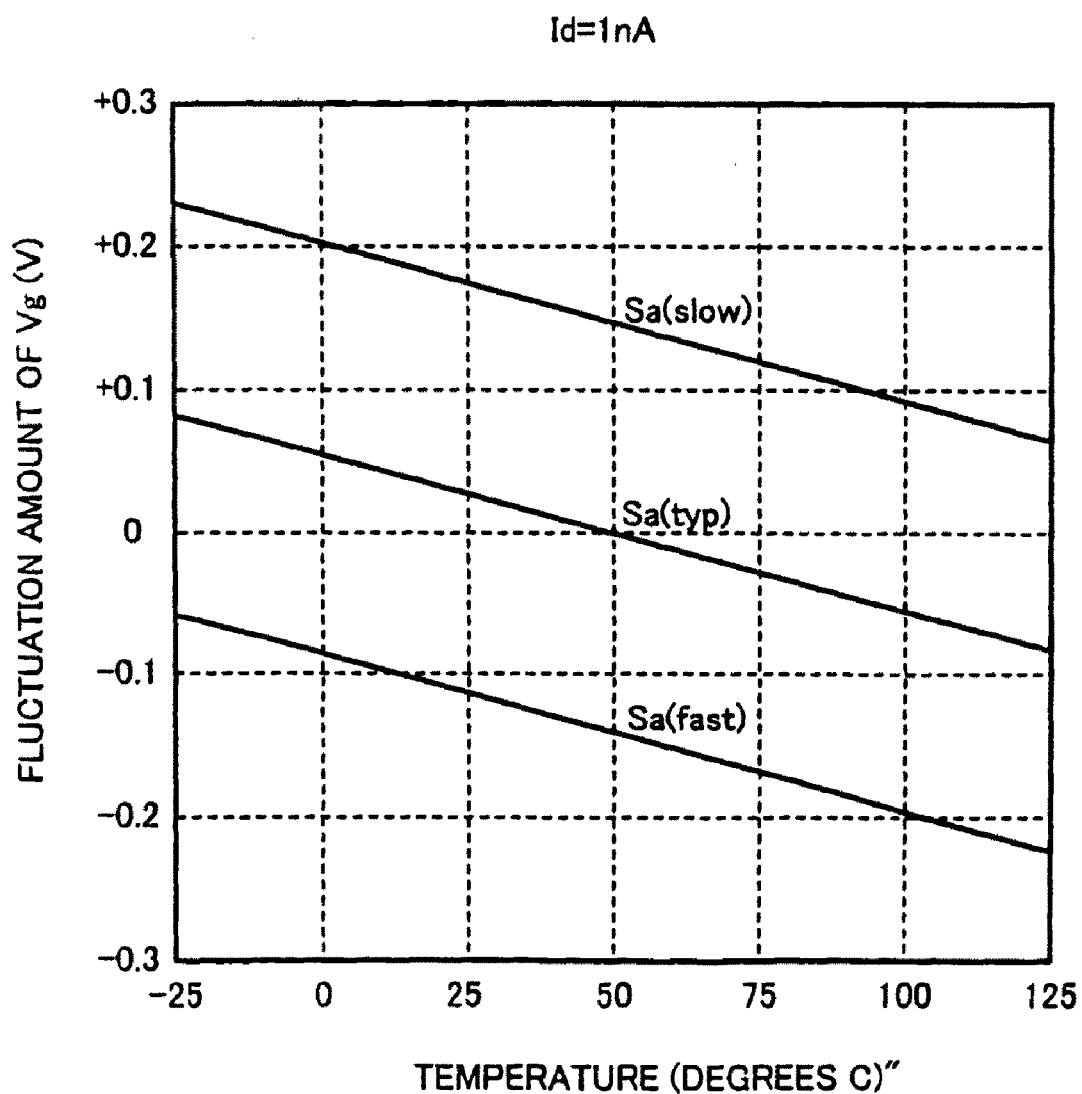
FIG. 17 is a graph showing an example of process/temperature dependency of a control voltage Vg outputted from the above control voltage generating circuit of FIG. 16.

FIG. 17 is a graph showing an example of process/temperature dependency of the control voltage Vg outputted from the above control voltage generating circuit. In FIG. 17, three types of characteristics including a typical operation characteristic Sa(typ), a fast operation characteristic Sa(fast), and a slow operation characteristic Sa(slow) are compared corresponding to variation in manufacturing process, and each relation between the temperature and a fluctuation amount of the control voltage Vg is shown in the graph. In addition, the fluctuation amount of the control voltage Vg along the longitudinal axis is a value obtained by using a criterion in which the manufacturing process is "typ" and the temperature is 50 degrees. Here, the current Ib1 of the constant current source 40 in FIG. 16 is desired to be set to a small value, for example, 10 nA. This is because when driving the local bit line LBL in the charge distributing mode, a value of the current flowing in the MOS transistor Q1 finally becomes extremely small and the current Ib1 needs to match this value.

Figure 18:
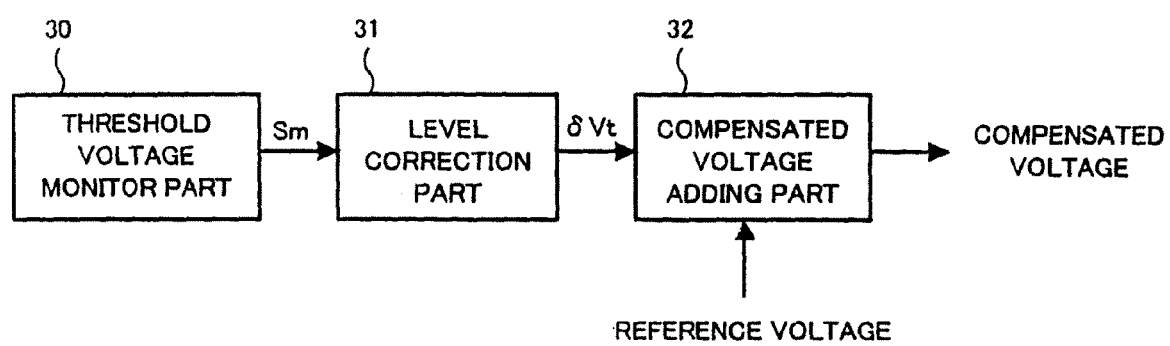
FIG. 18 is a block diagram showing another example of the compensated voltage generating circuit of the second embodiment.

Next, FIG. 18 is a block diagram showing another example of the compensated voltage generating circuit of the second embodiment, which is used to generate, for example, the voltages VSNH and VSNL of FIGS. 14 and 15, and the cell plate voltage VPLT of FIG. 14 and the voltage Vx. As shown in FIG. 18, the compensated voltage generating circuit includes a threshold voltage monitor part 30 which monitors the threshold voltage Vt3 of the MOS transistor Q3 of the local sense amplifier 10 and generates a monitor signal Sm, a level correction part 31 which shits the monitor signal Sm from the threshold voltage monitor part 30 by a correction amount corresponding to the manufacturing process and generates a correction signal δVt, and a compensated voltage adding part 32 which generates a compensated voltage by adding the reference voltage and the correction signal δVt of the level correction part 31.

Figure 19:
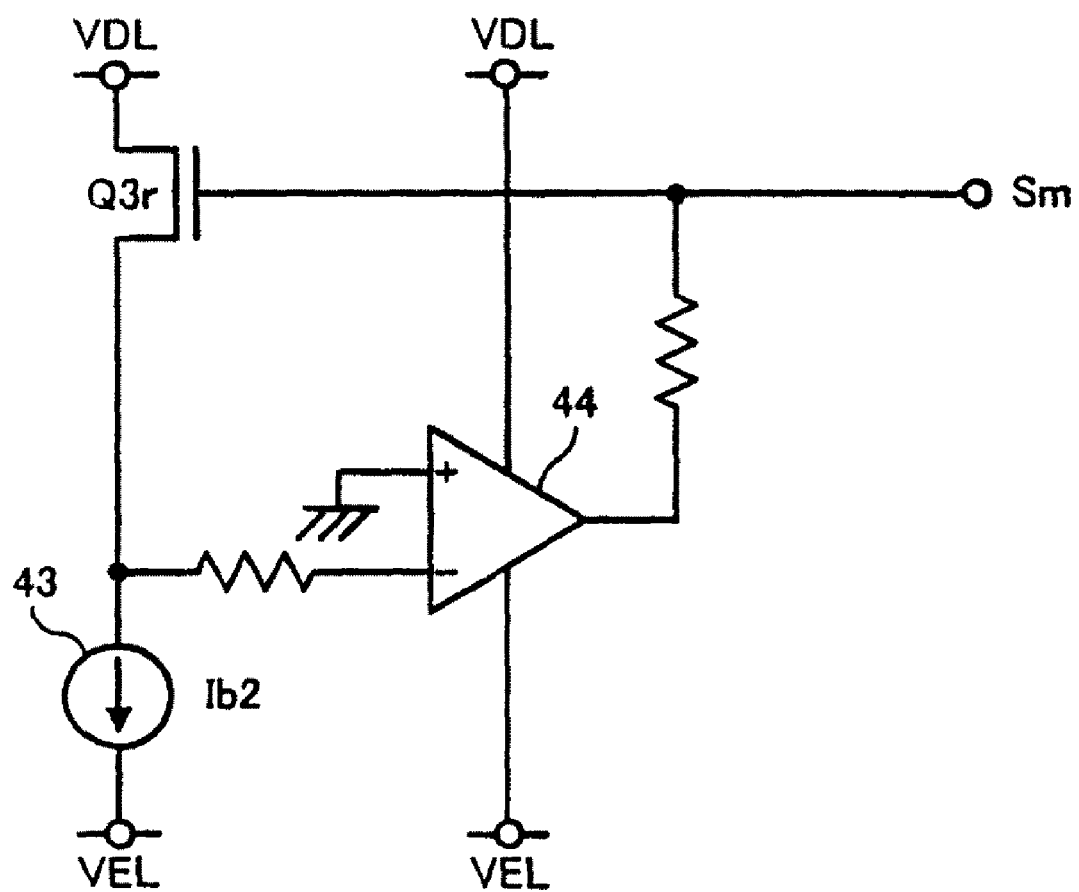
FIG. 19 is a diagram showing a circuit configuration example of a threshold voltage monitor part 30 of FIG. 18.

FIG. 19 shows a circuit configuration example of the threshold voltage monitor part 30 of FIG. 18. As shown in FIG. 19, the threshold voltage monitor part 30 includes a replica MOS transistor Q3r, a constant current source 43 and an operational amplifier 44. The replica MOS transistor Q3r functions as a replica transistor of the MOS transistor Q3 to be monitored, and formed in the same shape and size as the MOS transistor Q3. The constant current source 43 in which a constant current Ib2 flows has the same connection relation as the constant current source 40 of FIG. 16. The operational amplifier 44 receives a source voltage of the replica MOS transistor Q3r at a minus-side input terminal via a resistor, and receives the ground potential at a plus-side input terminal. An output voltage of the operational amplifier 44 is inputted to the gate of the replica MOS transistor Q3r via a resistor. In this case, feedback control is performed for the output signal Sm of the operational amplifier 44 so that the source voltage of the replica MOS transistor Q3r matches the ground potential. Accordingly, the threshold voltage Vt3 of the MOS transistor Q3r can be monitored by using the ground potential as a criterion based on the output signal Sm.

Figure 20:
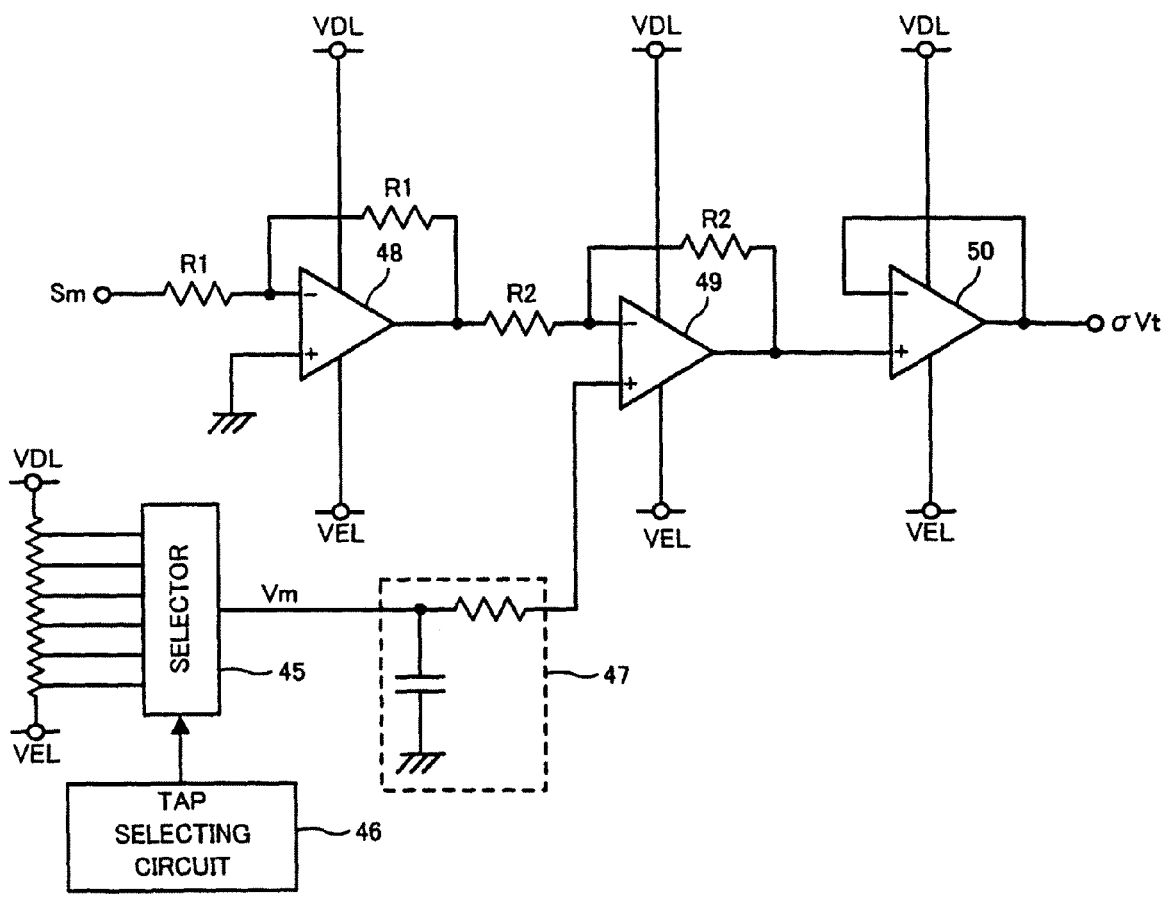
FIG. 20 is a diagram showing a circuit configuration example of a level correction part 31 of FIG. 18.

FIG. 20 shows a circuit configuration example of the level correction part 31 of FIG. 18. As shown in FIG. 20, the level correction part 31 includes a selector 45, a tap selecting circuit 46, a low pass filter 47, and three operational amplifiers 48, 49 and 50. The selector 45 functioning as a correction amount setting circuit sets a desired voltage selected from a large number of intermediate voltages between the positive power supply voltage VDL and the negative the power supply voltage VEL by resistive division based on correction amount information sent from the tap selecting circuit 46, and outputs a correction amount Vm. Selection of the intermediate voltages in the selector 45 is programmed in the tap selecting circuit 46. The correction amount Vm is set so that, for example, the correction signal δVt becomes 0V when the manufacturing process is "typ" and the temperature is 50 degrees. By setting the correction amount Vm in this manner, it is possible to obtain the correction signal δVt in which the fluctuation of the threshold voltage Vt3 of the MOS transistor Q3 due to the fluctuation of manufacturing process at the temperature of 50 degrees is compensated. In order to program the correction amount Vm, it is possible to utilize, for example, laser fuses, electrical fuses, a nonvolatile memory element, or a one-time programmable element.

The first operational amplifier 48 inverts and amplifies the monitor signal Sm of the threshold voltage monitor part 30, and outputs an inverted monitor signal −Sm. The second operational amplifier 49 receives the inverted monitor signal −Sm at a minus-side input terminal and receives the correction amount Vm smoothed through the low pass filter 47 composed of a resistor and a capacitor at a plus-side input terminal as s shifted voltage. When resistors R1 and R2 are arranged as shown in FIG. 20, a signal Sm+2 Vm obtained by adding 2 Vm to the signal Sm is outputted from the operational amplifier 49. The third operational amplifier 50 forms a voltage follower and outputs the correction signal δVt equal to Sm+2 Vm.

Figure 21:
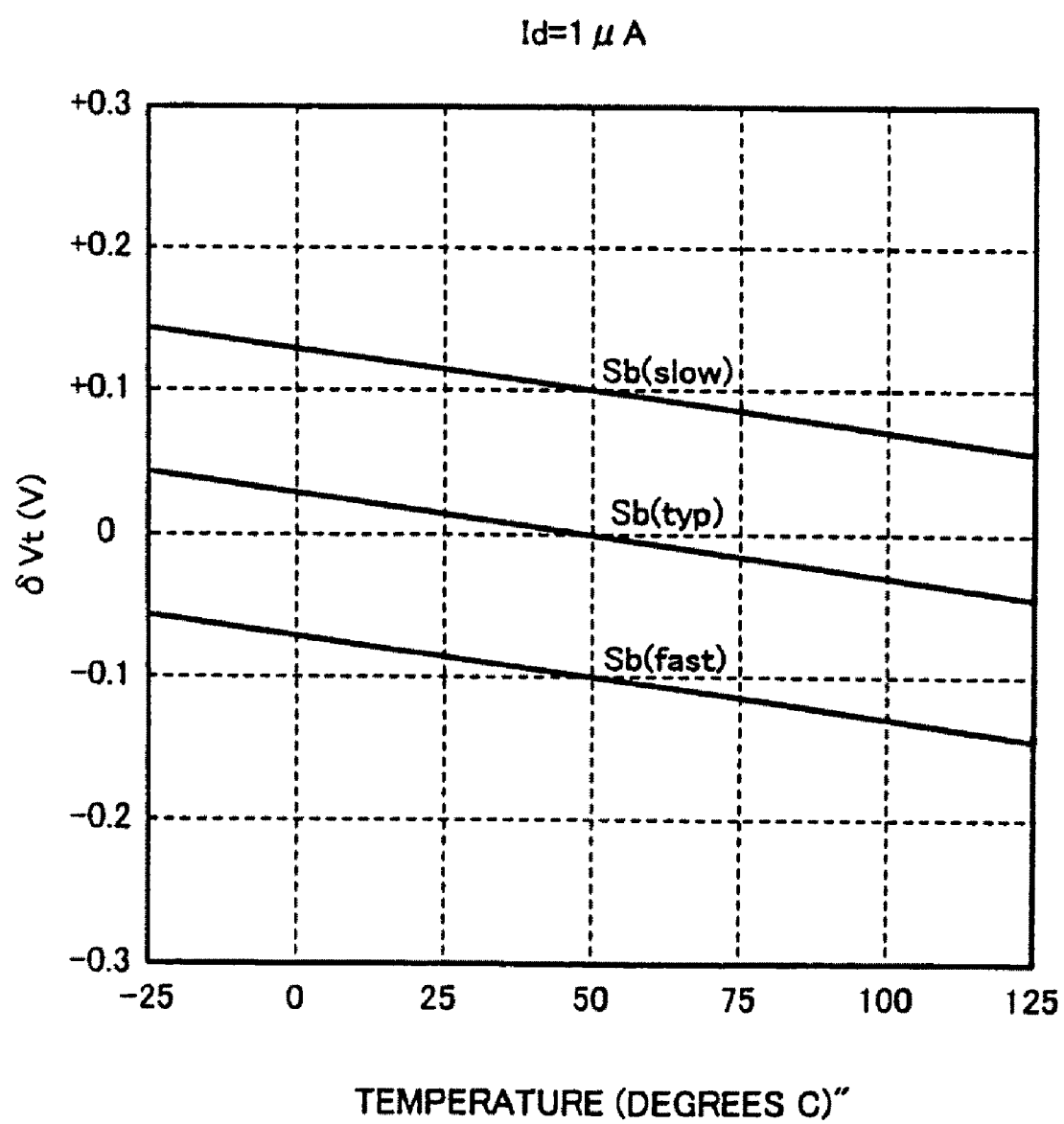
FIG. 21 is a graph showing an example of process/temperature dependency of a correction signal δVt outputted from the level correction part 31 of FIG. 18.

FIG. 21 is a graph showing an example of process/temperature dependency of the correction signal δVt outputted from the above level correction part 31. In FIG. 21, three operation characteristics Sb are shown in a graph in the same manner as in FIG. 17. Here, the current Ib2 of the constant current source 43 in FIG. 19 is desired to be set to a relatively large value, for example, 1 μA. This is because when driving the global bit line GBL to the ground VSS, a value of the current flowing in the MOS transistor Q3 is large to some extent and the current Ib2 needs to match this value.

Figure 22:
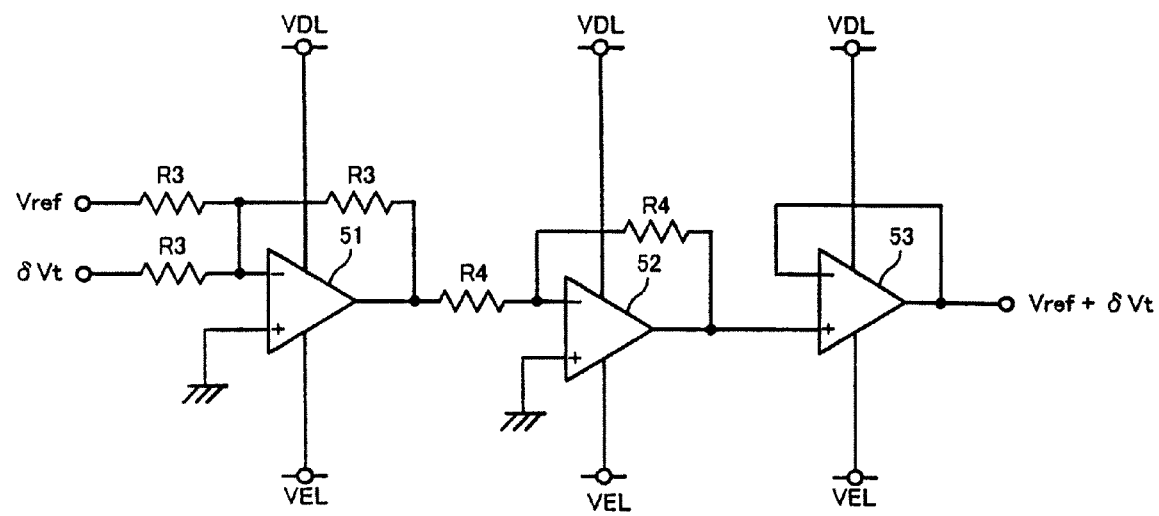
FIG. 22 is a diagram showing a circuit configuration example of a compensated voltage adding part 32 of FIG. 18.

FIG. 22 shows a circuit configuration example of the compensated voltage adding part 32 of FIG. 18. As shown in FIG. 22, the compensated voltage adding part 32 includes three operational amplifiers 51, 52 and 53. The first operational amplifier 51 adds the reference voltage Vref and the correction signal δVt of the level correction part 31 and inverts and amplifies the added signal. The second operational amplifier 52 further inverts and amplifies the output of the operational amplifier 51 and generates a voltage Vref+δVt. The third operational amplifier 53 forms a voltage follower and outputs the voltage Vref+δVt. As described above, the voltages VSNH and VSNL, the cell plate voltage VPLT, the predetermined voltage corresponding to the voltage Vx can be respectively used as the reference voltage Vref in FIG. 22. The value of the reference voltage Vref is set to, for example, 1.0V for the voltage VSNH, 0V for the voltage VSNL, and 0.5V for the cell plate voltage. In these cases, assuming that the value of the correction signal δVt is 0±0.1V, a voltage obtained by adding a fluctuation component ±0.1V to the reference voltage Vref in each case can be generated and supplied to a target circuit.

As described above, the fluctuation of the threshold voltage Vt3 of the MOS transistor Q3 due to manufacturing process and temperature can be reflected to each power supply based on the operation of the threshold voltage monitor part 30. Thus, respective values of the voltages VSNH and VSNL, the cell plate voltage VPLT and the voltage Vx can be appropriately set so as to compensate the fluctuation of the threshold voltage Vt3 of the MOS transistor Q3. For example, the voltage VSNH used to precharge the sense node Ns in the local sense amplifier 10 can be controlled to be increased following the increase of the threshold voltage Vt3 of the MOS transistor Q3, and reversely decreased following the decrease of the threshold voltage Vt3. Further, the voltage for writing data of high and low in the memory cell MC can be similarly controlled to be increased or decreased following a change in the threshold voltage Vt3 of the MOS transistor Q3. Furthermore, as to the control voltage Vx or as to the control voltage Vg generated by using the voltage Vx as a criterion, it is possible to control the voltage to be similarly increased or decreased following a change in threshold voltage Vt3 of the MOS transistor Q3. As a result, since each voltage in the sensing part changes in the same manner as the change in the threshold voltage Vt3 of the MOS transistor Q3, the actual variation can be reduced relative to the above-mentioned variation permissible range Rvt of the threshold voltage, thereby further improving the operating margin of the sense amplifier circuit.

In the foregoing, although the contents of the invention have been specifically described based on the embodiments, the invention is not limited the above-described embodiments, and can variously be modified without departing the essentials of the invention. For example, the above embodiments have described the local sense amplifier 10 (the sense amplifier circuit) including seven MOS transistors. However, the invention can be widely applied to various sense amplifier circuits having a first MOS transistor functioning as the charge transfer gate and a second MOS transistor amplifying the signal voltage via the first MOS transistor, a first voltage setting circuit setting the bit line to a first voltage, and a second voltage setting circuit setting the sense node to a second voltage, without restriction for other components.

The invention claimed is:

1. A semiconductor device having a single-ended type amplifier coupled to a bit line, the amplifier comprising:
   a first MOS transistor supplying a predetermined voltage to the bit line and switching connection between the bit line and a sense node in response to a control voltage applied to a gate thereof;
   a second MOS transistor having a gate connected to the sense node and amplifying a signal transmitted from the bit line via the first MOS transistor,
   a first voltage setting circuit setting the bit line to a first voltage in response to a first control signal; and
   a second voltage setting circuit setting the sense node to a second voltage in response to a second control signal,
   wherein after the bit line is set to the first voltage and the sense node is set to the second voltage, the bit line is driven in a charge distributing mode via the first MOS transistor so that a signal voltage at the sense node is amplified by the second MOS transistor.

2. The semiconductor device according to claim 1, wherein the first voltage is a ground potential and the second voltage is a predetermined power supply voltage.

3. The semiconductor device according to claim 2, wherein the first voltage setting circuit comprises a third MOS transistor switching connection between the bit line and the ground potential in response to the first control signal applied to a gate thereof.

4. The semiconductor device according to claim 1, wherein a variation permissible range of a threshold voltage of the first MOS transistor and a variation permissible range of a threshold voltage of the second MOS transistor are set within a range of a voltage difference at the sense node between high and low level data read out from the memory cell.

5. The semiconductor device according to claim 1, further comprising:
   a global sense amplifier connected to a global bit line which is selectively connected to a predetermined number of the local bit lines via the local sense amplifier, and including a signal voltage determination circuit determining a signal voltage level of the global bit line.

6. The semiconductor device according to claim 5, wherein the second voltage is supplied from the global sense amplifier to the second voltage setting circuit through the global bit line.

7. The semiconductor device according to claim 5, wherein the second voltage setting circuit comprises a fourth MOS transistor switching connection between the sense node and the global bit line in response to the second control signal applied to a gate thereof.

8. The semiconductor device according to claim 5, further comprising a fifth MOS transistor switching connection between a drain of the second MOS transistor and the global bit line in response to a third control signal applied to a gate thereof.

9. The semiconductor device according to claim 5, further comprising:
   a local sense amplifier including the first MOS transistor, the second MOS transistor, the first voltage setting circuit and the second voltage setting circuit, and amplifying a signal transmitted through a local bit line as the bit line; and
   a compensated voltage generating circuit generating a compensated voltage of which fluctuation of a threshold voltage of the first MOS transistor or the second MOS transistor is compensated for an input reference voltage, and supplying the compensated voltage to the local sense amplifier or the global sense amplifier.

10. The semiconductor device according to claim 1, further comprising another bit line and another MOS transistor supplying a predetermined voltage to the another bit line and switching connection between the another bit line and the sense node in response to another control voltage applied to a gate thereof.

11. The semiconductor device according to claim 1, further comprising a DRAM cell coupled to the bit line.

12. The semiconductor device according to claim 11, wherein a capacitance of the DRAM cell is less than or equal to 5fF.

13. The semiconductor device according to claim 1, wherein the amplifier operates at less than or equal to 1V.

14. A semiconductor device comprising:
   a global sense amplifier coupled between a first global bit line and a second global bit line via a first select transistor and a second select transistor respectively;
   a first local sense amplifier coupled between the first global bit line and a first local bit line; and
   a second local sense amplifier coupled between the second global bit line and a second bit line;
   wherein each of the first and second local amplifier comprises:
   a first MOS transistor supplying a predetermined voltage to the bit line and switching connection between the bit line and a sense node in response to a control voltage applied to a gate thereof;
   a second MOS transistor having a gate connected to the sense node and amplifying a signal transmitted from the bit line via the first MOS transistor;
   a first voltage setting circuit setting the bit line to a first voltage in response to a first control signal; and
   a second voltage setting circuit setting the sense node to a second voltage in response to a second control signal,
   wherein after the bit line is set to the first voltage and the sense node is set to the second voltage, the bit line is driven in a charge distributing mode via the first MOS transistor so that a signal voltage at the sense node is amplified by the second MOS transistor.

15. The semiconductor device according to claim 14, wherein the first voltage is a ground potential and the second voltage is a predetermined power supply voltage.

16. The semiconductor device according to claim 15, wherein the first voltage setting circuit comprises a third MOS transistor switching connection between the bit line and the ground potential in response to the first control signal applied to a gate thereof.

17. The semiconductor device according to claim 14, wherein a variation permissible range of a threshold voltage of the first MOS transistor and a variation permissible range of a threshold voltage of the second MOS transistor are set within a range of a voltage difference at the sense node between high and low level data read out from a memory cell.

18. The semiconductor device according to claim 14, wherein the global sense amplifier is connected to a selected one of the first and the second global bit lines which is selectively connected to a predetermined number of the local bit lines via the local sense amplifier, and includes a signal voltage determination circuit determining a signal voltage level of the selected one of the first and the second global bit lines.

19. The semiconductor device according to claim 18, wherein the second voltage is supplied from the global sense amplifier to the second voltage setting circuit through the selected one of the first and the second global bit lines.

20. The semiconductor device according to claim 18, wherein the second voltage setting circuit comprises a fourth MOS transistor switching connection between the sense node and the selected one of the first and the second global bit lines in response to the second control signal applied to a gate thereof.

21. The semiconductor device according to claim 18, further comprising a fifth MOS transistor switching connection between a drain of the second MOS transistor and the selected one of the first and the second global bit lines in response to a third control signal applied to a gate thereof.

22. The semiconductor device according to claim 14, further comprising a compensated voltage generating circuit generating a compensated voltage of which fluctuation of a threshold voltage of the first MOS transistor or the second MOS transistor is compensated for an input reference voltage, and supplying the compensated voltage to the local sense amplifier or the global sense amplifier.

23. The semiconductor device according to claim 14, further comprising a plurality of DRAM cells coupled to each of the first and second bit lines.

24. The semiconductor device according to claim 23, wherein a capacitance of each of the DRAM cells is less than or equal to 5fF.

25. The semiconductor device according to claim 14, wherein the local sense amplifier operates at less than or equal to 1V.

26. The semiconductor device according to claim 14, further comprising another bit line and another MOS transistor supplying a predetermined voltage to the another bit line and switching connection been the another bit line and each of the sense node of the first and second local amplifier in response to another control voltage applied to a gate thereof.

* * * * *